United States Patent [19]

Maeno

[11] Patent Number: 5,787,033
[45] Date of Patent: Jul. 28, 1998

[54] SEMICONDUCTOR MEMORY DEVICE WITH REDUCED PROBABILITY OF POWER CONSUMPTION

[75] Inventor: Hideshi Maeno, Tokyo, Japan

[73] Assignee: Mitsubishi Denki Kabushiki Kaisha, Tokyo, Japan

[21] Appl. No.: 684,209

[22] Filed: Jul. 19, 1996

[30] Foreign Application Priority Data

Aug. 22, 1995 [JP] Japan ................................ 7-213312
Feb. 7, 1996 [JP] Japan ................................ 8-021448

[51] Int. Cl.$^6$ .................................................. G11C 17/10
[52] U.S. Cl. ........................................ 365/182; 365/104
[58] Field of Search ............................ 365/182, 103, 365/104, 94

[56] References Cited

U.S. PATENT DOCUMENTS 5,477,484 12/1995 Nakashima ............................ 365/182

FOREIGN PATENT DOCUMENTS 0271412 6/1988 European Pat. Off. ............ 365/104
0064699 4/1983 Japan ................................ 365/104

*Primary Examiner*—David C. Nelms
*Assistant Examiner*—Son Mai
*Attorney, Agent, or Firm*—Oblon, Spivak, McClelland, Maier & Neustadt, P.C.

[57] ABSTRACT

A programming of memory cells in an upper block (UB) is reversely made, thereby obtaining reverse data which are opposite to desired data when the upper block (UB) is selected. An inverter circuit (IV) is additionally provided at an output of a sense amplifier (SA1) and inverts the reverse data, thus eventually obtaining the desired data. Having such configuration as to reduce the number of ON/OFF controllable memory cells, a semiconductor memory device which cuts power consumption is provided. Moreover, with OFF-state memory cells having such configuration as to suppress application of load (charge) capacity to bit lines and word lines as much as possible, the semiconductor memory device which ensures high-speed access to the memory cells is provided.

20 Claims, 28 Drawing Sheets

FIG. 18

| YA0 | YA1 | Y0 | Y1 | Y2 | Y3 |
|---|---|---|---|---|---|
| 0 | 0 | 1 | 0 | 0 | 0 |
| 1 | 0 | 0 | 1 | 0 | 0 |
| 0 | 1 | 0 | 0 | 1 | 0 |
| 1 | 1 | 0 | 0 | 0 | 1 |

SEMICONDUCTOR MEMORY DEVICE WITH REDUCED PROBABILITY OF POWER CONSUMPTION

BACKGROUND OF THE INVENTION

1. Field of the Invention

The present invention relates to a semiconductor memory device, and more particularly to a ROM (Read Only Memory) intended for operation with low power consumption and high-speed access to memory cells.

2. Description of the Background Art

< The First Background Art >

FIG. 25 is a circuit diagram showing an 8-word and 2-bit ROM 100. In the ROM 100 of FIG. 25, four word lines WL0, WL1, WL2 and WL3 and two pairs of bit lines, one pair of bit lines BL0 and BL1 and the other pair of bit lines BL2 and BL3, are crossed.

The four word lines WL0, WL1, WL2 and WL3 are connected to four outputs X0, X1, X2 and X3 of an X-decoder 1, respectively, which specifies an X-address.

The bit lines BL0 and BL1 are connected to the respective source electrodes of NMOS transistors C0 and C1. The drain electrodes of NMOS transistors C0 and C1 are connected in common to an input of an inverting sense amplifier SA1. The NMOS transistors C0 and C1 serve as a column selector CS1. The input of the inverting sense amplifier SA1 is connected to a power supply potential VDD through a pull-up resistor R1.

Similarly, the bit lines BL2 and BL3 are connected to the respective source electrodes of NMOS transistors C2 and C3, and the drain electrodes of NMOS transistors C2 and C3 are connected in common to an input of an inverting sense amplifier SA2. The NMOS transistors C2 and C3 serve as a column selector CS2. The input of the inverting sense amplifier SA2 is connected to a power supply potential VDD through a pull-up resistor R2.

The gate electrodes of NMOS transistors C0 and C2 are connected to an output Y0 of a Y-decoder 2 which specifies a Y-address and the NMOS transistors C0 and C2 operate in common in accordance with a signal outputted from the output Y0 of the Y-decoder 2. Therefore the bit lines BL0 and BL2 also operate in common. The gate electrodes of NMOS transistors C1 and C3 are connected to an output Y1 of the Y-decoder 2 and the NMOS transistors C1 and C3 operate in common in accordance with a signal outputted from the output Y1 of the Y-decoder 2. Therefore the bit lines BL1 and BL3 also operate in common.

Accordingly, eight addresses can be specified in the ROM 100 with word lines WL0, WL1, WL2 and WL3 and bit lines BL0, BL1, BL2 and BL3, and two memory cells are provided at each address and can be individually programmed.

For example, assuming that reference character M00 represents an address of the memory cell which is selected when the output X0 of the X-decoder 1 and the output Y0 of the Y-decoder 2 are activated, in a memory block UB (referred to as "upper block") consisting of the word lines WL0 to WL3 and the bit lines BL0 and BL1, addresses of the respective memory cells in the upper column consisting of word lines WL0 to WL3 and bit line BL0 are represented by reference characters M00, M10, M20 and M30 from the left-hand side and addresses of the respective memory cells in the lower column consisting of the word lines WL0 to WL3 and the bit line BL1 are represented by reference characters M0, M11, M21 and M31 also from the left-hand side. The same rule applies correspondingly to a memory block DB (referred to as "lower block") consisting of the word lines WL0 to WL3 and the bit lines BL2 and BL3. For the convenience of discussion, the memory cell located at the address M00 is referred to as a memory cell M00.

In the ROM 100 of FIG. 25, memory cells each including an NMOS transistor of which the drain electrode is connected to one of the bit lines, the source electrode is connected to the ground potential (GND) and the gate electrode is connected to one of the word lines and which is controllable in ON/OFF of a main current by ON/OFF operation of the gate electrode (referred to as "ON/OFF controllable memory cells" hereinafter) and memory cells each of which has no main current (direct current) path between the bit line and the ground potential GND, regardless of the potential of the word line, (referred to as "OFF-state memory cells" hereinafter are mixed. Programming of the ROM 100 is made by combination of the ON/OFF controllable memory cells and the OFF-state memory cells.

In the ROM 100 of FIG. 25, the memory cells M00 and M11 of the upper block UB and the memory cells M00, M10, M30, M01, M11 and M21 of the lower block DB are the OFF-state memory cells.

Now, the OFF-state memory cell will be discussed, with reference to FIGS. 26 and 27. A memory cell includes an NMOS transistor which is configured as shown in FIG. 26, where the gate electrode is connected to a word line WL, the source electrode is connected to the ground potential GND and the drain electrode is not connected any bit line BL, being in an open state. Another memory cell includes an NMOS transistor which is configured as shown in FIG. 27, where the gate electrode is connected to the word line WL, the drain electrode is connected to the bit line BL and the source electrode is not connected to the ground potential GND, being in the open state.

Any one of two types of memory cells having the above different configurations of OFF-state memory cell may be used in the ROM 100. A specific example of programming of the ROM 100 will be discussed below, taking the case of the configuration of FIG. 26, with reference to FIG. 28.

In the upper column of the upper block UB of FIG. 28, an NMOS transistor N1 of the memory cell M00 has a drain electrode which is not connected to the bit line BL0, and NMOS transistors N2, N3 and N4 of the memory cells M10, M20 and M30 have drain electrodes which are connected to the bit line BL0.

In the lower column of the upper block UB of FIG. 28, an NMOS transistor N6 of the memory cell M11 has a drain electrode which is not connected to the bit line BL1, and NMOS transistors of other memory cells have drain electrodes which are connected to the bit line BL1.

On the other hand, in the upper column of the lower block DB, an NMOS transistor N11 has a drain electrode which is connected to the bit line BL2, and NMOS transistors of other memory cells have drain electrodes which are not connected to the bit line BL2.

In the lower column of the lower block DB, an NMOS transistor N16 of the memory cell M31 has a drain electrode which is connected to the bit line BL3, and NMOS transistors of other memory cells have drain electrodes which are not connected to the bit line BL3.

Next, an operation of the ROM 100 will be discussed. For example, when the output X0 of the X-decoder 1 and the output Y0 of the Y-decoder 2 are activated and the memory cell M00 is selected, no current flows between the source and drain of NMOS transistor N1 since the drain electrode of NMOS transistor N1 is not connected to the bit line BL0, and in consequence the input of the inverting sense amplifier SA1 becomes "1" (High-level) through the pull-up resistor R1. Accordingly, the output of the inverting sense amplifier SA1 becomes "0" (Low-level). Since the drain electrode of NMOS transistor N9 is not connected to the BL2, the input of the inverting sense amplifier SA2 becomes "1" (High-level) through the pull-up resistor R2 and accordingly the output of the inverting sense amplifier SA2 becomes "0" (Low-level).

On the other hand, when the memory cell M10 is selected, a current flows between the source and drain of NMOS transistor N2 since the drain electrode of NMOS transistor N2 is connected to the bit line BL0, and in consequence the input of the inverting sense amplifier SA1 becomes "0". Accordingly, the output of the inverting sense amplifier SA1 becomes "1". Since the drain electrode of NMOS transistor N10 is not connected to the bit line BL2, the input of the inverting sense amplifier SA2 becomes "1" through the pull-up resistor R2 and accordingly the output of the inverting sense amplifier SA2 becomes "0".

Thus, the programming of the ROM 100 depends on whether the drain electrode of NMOS is connected to the bit line or not, and if the out put data is required to be "1", the drain electrode have to be connected to the bit line.

The programming of the ROM is generally determined in accordance with the needs of the user. For example, the above programming of the ROM is made so as to reflect the user's need that when the memory cell M00 is selected in the upper column of the upper block UB of the ROM 100, the output of the ROM becomes "0", and when one of the memory cells M10, M20 and M30 is selected, the output of the ROM becomes "1".

In the configuration of the ROM 100 as shown in FIG. 28, a direct current flows by turning on the NMOS transistor when access is made to the memory cell which is programmed to produce an output of "1". Therefore, high-probability of access to the memory cells which are programmed to produce an output of "1" results in high power consumption.

In the upper block UB of the ROM 100 of FIG. 28, for example, there are six memory cells which are programmed to produce an output of "1", i.e., M10, M20, M30, M01, M21 and M31. If access to every memory cell is made with equal probability, the probability of access to the memory cell which is programmed to produce an output of "1" is 6/8 (75%). The probability of direct current flowing is 75%.

On the other hand, there are two memory cells which are programmed to produce output data of "1", i.e., M20 and M31 in the lower block DB, and the probability of access to the memory cell which is programmed to produce an output of "1" is 2/8 (25%). The probability of direct current flowing is 25%. It is accordingly found that the lower block DB requires lower power consumption than the upper block UB.

As discussed above, in a case of a program reflecting the needs of the user, if access to every memory cell is made with equal probability, there arises a problem in the background-art ROM 100 that the power consumption becomes higher with an increase in the number of memory cells whose NMOS transistors turn on when selected.

The same problem arises in a case where the programming of the ROM depends on whether the source electrode of NMOS transistor is connected to the ground potential GND or not, in other words, a case of OFF-state memory cell including the NMOS transistor of FIG. 27 in which the source electrode is not connected to the ground potential GND, being in the open state.

Further, the same problem arises in a case where the programming of the ROM depends on whether the gate electrode of NMOS transistor is connected to one of the word lines WL0, WL1, WL2 and WL3 or connected to the ground potential GND. An OFF-state memory cell including an NMOS transistor in which the gate electrode is not connected to the word line but connected to the ground potential GND, to be fixed into an OFF state, will be discussed below.

FIG. 29 is a circuit diagram of a ROM 200 in which the above OFF-fixed NMOS transistor is employed in the OFF-state memory cell of FIG. 25. In FIG. 29, like elements are given the same reference characters as those of FIG. 25 and duplicate discussion will be omitted.

In the upper column of the upper block UB of FIG. 29, the gate electrode of NMOS transistor N1 of the memory cell M00 is not connected to the word line WL0 but connected to the ground potential GND and the gate electrodes of NMOS transistors of other memory cells are connected to the word lines.

In the lower column of the upper block UB, the gate electrode of NMOS transistor N6 of the memory cell M11 is not connected to the word line WL1 but connected to the ground potential GND and the gate electrodes of NMOS transistors of other memory cells are connected to the word lines.

In the upper column of the lower block DB, the gate electrode of NMOS transistor N11 of the memory cell M20 is connected to the word line WL2 and the gate electrodes of NMOS transistors of other memory cells are not connected to the word lines but connected to the ground potential GND.

In the lower column of the lower block DB, the gate electrode of NMOS transistor N16 of the memory cell M31 is connected to the word line WL3 and the gate electrodes of NMOS transistors of other memory cells are not connected to the word lines but connected to the ground potential GND.

Next, an operation of the ROM 200 will be discussed. For example, when the output X0 of the X-decoder 1 and the output Y0 of the Y-decoder 2 are activated and the memory cell M00 is selected, no current flows between the source and drain of NMOS transistor N1 since the gate electrode of NMOS transistor N1 is not connected to the word line WL0, and in consequence the input of the inverting sense amplifier SA1 becomes "1" (High-level) through the pull-up resistor R1. Accordingly, the output of the inverting sense amplifier SA1 becomes "0" (Low-level). Thus, an operation of the memory cell in which the gate electrode of NMOS transistor is not connected to the word line but connected to the GND to be fixed into the off-state is the same as that of the memory cell in which the drain electrode of NMOS transistor is not connected to the bit line shown in FIG. 28. Therefore, if access to every memory cell is made with equal probability, there arises a problem, also in the ROM 200, that the power consumption becomes higher with an increase in the number of memory cells whose NMOS transistors turn on when selected.

Furthermore, although the ROMs 100 and 200 of FIGS. 25 and 29 include the pull-up resistors R1 and R2, even if transistors for precharge are used instead of the pull-up resistors, there also arises the problem that the probability of discharge current flowing increases to cause an operation with high power consumption.

< The Second Background Art >

FIG. 30 is a circuit diagram showing an 8-word and 2-bit ROM 300. In FIG. 30, like elements are given the same reference characters as those of the ROM 100 as shown in FIG. 25 and duplicate discussion will be omitted.

FIG. 31 is a circuit diagram of the ROM 300 in which the above OFF-fixed NMOS transistor is employed in the OFF-state memory cell of FIG. 30.

In the upper column of the upper block UB of FIG. 31, the gate electrode of NMOS transistor N1 of the memory cell M00 is connected to the word line WL0 and the gate electrodes of NMOS transistors of other memory cells are not connected to the word lines but connected to the ground potential GND.

In the lower column of the upper block UB, the gate electrode of NMOS transistor N6 of the memory cell M11 is connected to the word line WL1 and the gate electrodes of NMOS transistors of other memory cells are not connected to the word lines but connected to the ground potential GND.

In the upper column of the lower block DB, the gate electrode of NMOS transistor N11 of the memory cell M20 is connected to the word line WL2 and the gate electrodes of NMOS transistors of other memory cells are not connected to the word lines but connected to the ground potential GND.

In the lower column of the lower block DB, the gate electrode of NMOS transistor N16 of the memory cell M31 is connected to the word line WL2 and the gate electrodes of NMOS transistors of other memory cells are not connected to the word lines but connected to the ground potential GND.

The memory cell in which the gate electrode of NMOS transistor is not connected to the word line and the memory cell in which the gate electrode of NMOS transistor is connected to the word line operate in the same manner as those of the ROM 200 shown in FIG. 29. Since there is only one memory cell which is programmed to produce an output of "1", i.e., M00 in the upper column of the upper block UB, if access to every memory cell is made with equal probability, the probability of access to the memory cell which is programmed to produce an output of "1" is therefore ¼ (25%) and the probability of direct current flowing is 25%.

On the other hand, since there are three memory cells which are programmed to produce an output of "1", i.e., M01, M21 and M31 in the lower column of the upper block UB, if access to every memory cell is made with equal probability, the probability of access to the memory cells which are programmed to produce an output of "1" is ¾ (75%) and the probability of direct current flowing is 75%. Accordingly, the probability of direct current flowing in the upper block UB combining the upper and lower columns is 50%.

In the lower block DB, the probability of access to the memory cell which is programmed to produce an output "1" is ¼ (25%) in both cases of the upper and lower columns, and the probability of direct current flowing is 25% in the lower block DB combining the upper and lower columns.

Therefore, if access to every memory cell is made with equal probability, there arises a problem, also in the ROM 300, that the power consumption becomes higher with an increase in the number of memory cells whose NMOS transistors turn on when selected.

< The Third Background Art >

Referring to FIG. 32, a 16-word ROM 400 which uses four columns for 1-bit data output will be now discussed although the background-art ROMs 100 to 300 as discussed earlier are all 8-word and 2-bit ROMs.

In the ROM 400 of FIG. 32, four word lines WL0, WL1, WL2 and WL3 and four bit lines BL0, BL1, BL2 and BL3 are crossed. The four word lines WL0, WL1, WL2 and WL3 are connected to four outputs X0, X1, X2 and X3 of the X-decoder 1, respectively, which specifies an X-address.

The bit lines BL0, BL1, BL2 and BL3 are connected to the respective source electrodes of NMOS transistors C0, C1, C2 and C3. The drain electrodes of NMOS transistors C0, C1, C2 and C3 are connected in common to an input of an inverting sense amplifier SA. The NMOS transistors C0, C1, C2 and C3 serve as a column selector CS. The input of the inverting sense amplifier SA is connected to a power supply potential VDD through a pull-up resistor R.

The gate electrodes of NMOS transistors C0, C1, C2 and C3 are connected to outputs Y0, Y1, Y2 and Y3 of a Y-decoder 3, respectively, which specifies a Y-address.

A memory cell row consisting of the word lines WL0, WL1, WL2 and WL3 and the bit line BL0 is referred to as "the first column" and memory cells therein are represented by the reference characters M00, M10, M20 and M30 from the left-hand side. Similarly, a memory cell row consisting of the word lines WL0, WL1, WL2 and WL3 and the bit line BL1 is referred to as "the second column" and memory cells therein are represented by the reference characters M01, M11, M21 and M31 from the left-hand side. A memory cell row consisting of the word lines WL0, WL1, WL2 and WL3 and the bit line BL2 is referred to as "the third column" and memory cells therein are represented by the reference characters M02, M12, M22 and M32 from the left-hand side. A memory cell row consisting of the word lines WL0, WL1, WL2 and WL3 and the bit line BL3 is referred to as "the fourth column" and memory cells therein are represented by the reference characters M03, M13, M23 and M33 from the left-hand side. Further, in a ROM 400 shown in FIG. 32, the memory cells M10, M20, M30, M11, M22 and M33 are the OFF-state memory cells.

FIG. 33 is a circuit diagram of the ROM 400 in which the above OFF-fixed NMOS transistor is employed in the OFF-state memory cell of FIG. 32.

As shown in FIG. 33, in the first column, the gate electrode of NMOS transistor N1 of the memory cell M00 is connected to the word line WL0, and the gate electrodes of NMOS transistors of other memory cells are connected to the ground potential GND.

In the second column, the gate electrode of NMOS transistor N6 of the memory cell M11 is connected to the ground potential GND, and the gate electrodes of NMOS transistors of other memory cells are connected to the word lines.

In the third column, the gate electrode of NMOS transistor N11 of the memory cell M22 is connected to the ground potential GND, and the gate electrodes of NMOS transistors of other memory cells are connected to the word lines.

In the fourth column, the gate electrode of NMOS transistor N16 of the memory cell M33 is connected to the ground potential GND, and the gate electrodes of NMOS transistors of other memory cells are connected to the word lines.

The memory cell in which the gate electrode of NMOS transistor is not connected to the word line and the memory cell in which the gate electrode of NMOS transistor is connected to the word line operate in the same manner as those of the ROM 200 shown in FIG. 29. Since there is only one memory cell which is programmed to produce an output of "1", i.e., M00 in the first column, if access to every memory cell is made with equal probability, the probability of access to the memory cell which is programmed to produce an output of "1" is therefore ¼ (25%) and the probability of direct current flowing is 25%.

Since there are three memory cells which are programmed to produce an output of "1", i.e., M01, M21 and M31 in the second column, if access to every memory cell is made with equal probability, the probability of access to the memory cells which are programmed to produce an output of "1" is ¾ (75%) and the probability of direct current flowing is 75%.

Since there are three memory cells which are programmed to produce an output of "1", i.e., M02, M12 and M32 in the third column, if access to every memory cell is made with equal probability, the probability of access to the memory cells which are programmed to produce an output of "1" is ¾ (75%) and the probability of direct current flowing is 75%.

Since there are three memory cells which are programmed to produce an output of "1", i.e., M03, M13 and M23 in the fourth column, if access to every memory cell is made with equal probability, the probability of access to the memory cells which are programmed to produce an output of "1" is ¾ (75%) and the probability of direct current flowing is 75%.

In the ROM 400 on the whole, one memory cell is selected out of the sixteen memory cells, and therefore the probability of direct current flowing is 62.5% (¹⁰⁄₁₆).

Therefore, if access to every memory cell is made with equal probability, there arises a problem, also in the ROM 400, that the power consumption becomes higher with an increase in the number of memory cells whose NMOS transistors turn on when selected.

Thus, in the background-art semiconductor memory devices, as discussed above, there arises the problem that the power consumption becomes higher with an increase in the number of ON/OFF controllable memory cells. Furthermore, there exists another problem that since the OFF-state memory cells have the transistors which are connected to the bit lines and word lines even if they do not turn on when selected, an increase in load (charge) capacity of the bit lines and word lines hinders speeding-up of access to the memory cells.

SUMMARY OF THE INVENTION

The present invention is directed to a semiconductor memory device. According to a first aspect of the present invention, the semiconductor memory device comprises: a plurality of columns each including an array of a plurality of memory cells; and an output part connected to the plurality of columns, in which the plurality of memory cells include at least one ON/OFF controllable memory cell and at least one OFF-state memory cell, and the plurality of memory cells are programmed with desired data by selectively arranging at least one ON/OFF controllable memory cell and at least one OFF-state memory cell, and the semiconductor memory device further comprises at least one data inverting means connected to some columns of the plurality of columns, for inverting data outputted from the output part.

According to a second aspect of the present invention, in the semiconductor memory device of the first aspect, the desired data include data such that, if the above some columns of the plurality of columns are programmed with the desired data themselves, more than half of the plurality of memory cells in each of the above some columns become the ON/OFF controllable memory cells, and the above some columns of the plurality of columns are programmed with reverse data of the desired data so that more than half of the plurality of memory cells in each of the above some columns become the OFF-state memory cells.

According to a third aspect of the present invention, in the semiconductor memory device of the first aspect, the desired data include data such that, if the above some columns of the plurality of columns are programmed with the desired data themselves, access is made to the ON/OFF controllable memory cells in each of the above some columns with a probability of more than 50%, and the above some columns of the plurality of columns are programmed with reverse data of the desired data so that access is made to the OFF-state memory cells in each of the above some columns with a probability of more than 50%.

According to a fourth aspect of the present invention, in the semiconductor memory device of the first aspect, the data inverting means is an inverter circuit.

According to a fifth aspect of the present invention, the semiconductor memory device of the first aspect further comprises a plurality of column selecting means provided between the output part and the plurality of columns respectively, for determining whether the respective columns are selected or not in accordance with a column selection signal externally applied, in which the data inverting means inverts the data outputted from the output part only when the above some columns are selected.

According to a sixth aspect of the present invention, in the semiconductor memory device of the fifth aspect, the data inverting means is a two-input exclusive OR circuit in which one input is connected to the output part and the other input is given the column selection signal.

According to a seventh aspect of the present invention, in the semiconductor memory device of the fifth aspect, the data inverting means includes column discrimination means for judging whether the above some columns are selected or not in accordance with the column selection signal, the column discrimination means is a combinational logic circuit having inputs as much as the above some columns, the column selection signal applied to the column selecting means of the above some columns is connected to one of the inputs of the combinational logic circuit, and a control signal for controlling the data inverting means is outputted to invert the data outputted from the output part when the above some columns are selected.

According to an eighth aspect of the present invention, in the semiconductor memory device of the seventh aspect, the combinational logic circuit is an OR circuit having inputs as much as the above some columns.

According to a ninth aspect of the present invention, in the semiconductor memory device of the fifth aspect, the data inverting means includes column discrimination means for judging whether the above some columns are selected or not in accordance with the column selection signal, the column discrimination means is a combinational logic circuit having inputs as much as the plurality of columns, the column selection signal applied to the column selecting means of the above some columns is connected to one of the inputs of the combinational logic circuit, other inputs of the combinational logic circuit which do not receive the column selection signal are fixed in a prescribed logic, and a control signal for controlling the data inverting means is outputted to invert the data outputted from the output part when the above some columns are selected.

According to a tenth aspect of the present invention, in the semiconductor memory device of the ninth aspect, the combinational logic circuit is an OR circuit having inputs as much as the plurality of columns.

According to an eleventh aspect of the present invention, in the semiconductor memory device of the fifth aspect, the data inverting means includes column discrimination means for judging whether the above some columns are selected or not in accordance with the column selection signal, the column discrimination means is a combinational logic circuit having inputs half as much as the plurality of columns, a control signal for controlling the data inverting means is outputted to invert the data outputted from the output part when the above some columns are selected by means that the column selection signal applied to the column selecting means of the plurality of columns other than the above some columns is connected to the inputs of the combinational logic circuit and other inputs of the combinational logic circuit which do not receive the column selection signal are fixed in a prescribed logic, or the column selection signal applied to the column selecting means of the above some columns is connected to the inputs of the combinational logic circuit and other inputs of the combinational logic circuit which do not receive the column selection signal are fixed in a prescribed logic.

According to a twelfth aspect of the present invention, in the semiconductor memory device of the eleventh aspect, the combinational logic circuit includes an OR circuit having inputs half as much as the plurality of columns and a two-input exclusive OR circuit in which one input is connected to an output of the OR circuit and the other input is fixed in a prescribed logic.

According to a thirteenth aspect of the present invention, in the semiconductor memory device of the first aspect, at least one OFF-state memory cell and at least one ON/OFF controllable memory cell have transistors, and the transistors are of the same conductivity type.

According to a fourteenth aspect of the present invention, in the semiconductor memory device of the fifth aspect, at least one OFF-state memory cell and at least one ON/OFF controllable memory cell have transistors, and wherein the transistors include N-channel transistors and P-channel transistors, and each of the plurality of columns includes the transistors of the same conductivity type.

According to a fifteenth aspect of the present invention, the semiconductor memory device comprises: at least one column pair consisting a first column including an array of a plurality of memory cells each of which has an N-channel transistor and a second column including an array of a plurality of memory cells each of which has a P-channel transistor; and an output part connected to the column pair, in which the first column and the second column are selected interlockedly, and the plurality of memory cells in the first column and the second column are programmed with desired data by making connection of the N-channel transistor and the P-channel transistor in the memory cells of the same X-address in the first column and the second column so that one of these transistors may be ON/OFF controllable and the other may be fixed in an OFF state, and wherein if more than half of the P-channel transistors in the second column are ON/OFF controllable when programmed with the desired data themselves, the plurality of memory cells are programmed with reverse data which are opposite to the desired data so that more than half of the N-channel transistors in the first column may be ON/OFF controllable, and the semiconductor memory device further comprises data inverting means for inverting the reverse data outputted from the output part.

According to a sixteenth aspect of the present invention, in the semiconductor memory device of the fifteenth aspect, the at least one column pair includes a plurality of column pairs, each of the column pairs is programmed with either the desired data or the reverse data, and the data inverting means inverts the reverse data only when a column pair programmed with the reverse data is selected.

According to a seventh aspect of the present invention, in the semiconductor memory device of the fifteenth aspect, each of the transistors which are fixed in an OFF state has a control electrode which is not connected to a word line but connected to a prescribed potential to always keep the transistors in an OFF state.

According to an eighteenth aspect of the present invention, in the semiconductor memory device of the fifteenth aspect, each of the transistors which are fixed in an OFF state has a control electrode which is not connected to a word line but connected to a prescribed potential to always keep the transistors in an OFF state, and two main electrodes neither of which is connected to a bit line.

According to a nineteenth aspect of the present invention, in the semiconductor memory device of the eighteenth aspect, the N-channel transistors are NMOS transistors formed as basic cell units of CMOS gate array, and the P-channel transistors are PMOS transistors formed as basic cell units of CMOS gate array.

According to a twentieth aspect of the present invention, a semiconductor memory device comprises: a bit line; a word line; and a transistor, in which the transistor has a control electrode which is not connected to the word line but connected to a prescribed potential to always keep the transistor in an OFF state, and the transistor has two main electrodes neither of which is connected to the bit line.

The semiconductor memory device of the first aspect of the present invention ensures reduction in power consumption in a case where more than half of the memory cells in a column are the ON/OFF controllable memory cells or access is made to the ON/OFF controllable memory cells with a probability of more than 50%, to thereby increase power consumption, when the column is programmed with the desired data without reversal.

In the semiconductor memory device of the second aspect of the present invention, the above some columns are programmed with data such that more than half of the memory cells are the OFF-state memory cells and the outputted reverse data are further inverted by the data inverting means to obtain the desired data. Thus, the semiconductor memory device of the second aspect ensures reduction in power consumption in a case where more than half of the memory cells in a column are the ON/OFF controllable memory cells, to thereby increase power consumption, when the column is programmed with the desired data without reversal.

In the semiconductor memory device of the third aspect of the present invention, the above some columns are programmed with data such that access is made to said OFF-state memory cells in each of the above some columns with a probability of more than 50% and the outputted reverse data are further inverted by the data inverting means to obtain the desired data. Thus, the semiconductor memory device of the third aspect ensures reduction in power consumption in a case where access is made to said ON/OFF controllable memory cells in each of the above some columns with a probability of more than 50%, to thereby increase power consumption, when the column is programmed with the desired data without reversal.

The fourth aspect of the present invention is suitably applied to the semiconductor memory device in which the outputs from all of the columns need to be inverted since the inverter circuit is used as the data inverting means.

The fifth aspect of the present invention is suitably applied to the semiconductor memory device which includes both the columns programmed with the desired data and the above some columns provided with the data inverting means since the data inverting means inverts the reverse data only when the above some columns are selected.

The sixth aspect of the present invention is suitably applied to the semiconductor memory device in which the data outputted from the output part are inverted only when the above some columns are selected since the two-input exclusive OR circuit acts as an inverter circuit to invert the data outputted from the output part only when the column selection signal applied to the input thereof becomes High-Level.

In the semiconductor memory device of the seventh aspect of the present invention, the combinational logic circuit having inputs as much as the above some columns is used. Therefore, when the number of the above some columns is small, the size of the combinational logic circuit can be reduced and accordingly a semiconductor memory device of small size can be provided.

In the semiconductor memory device of the eighth aspect of the present invention, since the OR circuit having inputs as much as the above some columns is used as a combinational logic circuit, the data inverting means is supplied with an output of High-Level if at least one of the column selection signals applied to the inputs of the OR circuit becomes High-Level.

The ninth aspect of the present invention is adaptable to a variety of semiconductor memory devices which are various in the number of the above some columns through a change of interconnection without changing the configuration of the combinational logic circuit since the combinational logic circuit having inputs as much as the plurality of columns is used as the column discrimination means. Therefore, a semiconductor memory device with high flexibility can be provided.

In the semiconductor memory device of the tenth aspect of the present invention, the OR circuit having inputs as much as the plurality of columns is used as the combinational logic circuit. If there is a column programmed with the desired data, by connecting the input of the OR circuit which receives the column selection signal for that column to be fixed in Low-Level, the data inverting means is supplied with an output of High-Level when at least one of the column selection signals applied to other inputs becomes High-Level.

In the semiconductor memory device of the eleventh aspect of the present invention, since the combinational logic circuit having inputs half as much as the plurality of columns is used as column discrimination means, the number of wires to connect the inputs of the combinational logic circuit to the column selection signals respectively is reduced to half, thereby simplifying a layout and saving time and labor which may be needed in a wiring process when a large number of columns are used.

The semiconductor memory device of the twelfth aspect of the present invention is adaptable to a variety of selection patterns of columns by a change of connection between the inputs of the OR circuit and the column selection signals and a change of the prescribed logic of the input of the two-input exclusive OR circuit since the combinational logic circuit includes an OR circuit having inputs half as much as the plurality of columns and a two-input exclusive OR circuit in which one input is connected to an output of the OR circuit and the other input is fixed in a prescribed logic.

In the semiconductor memory device of the thirteenth aspect of the present invention, since the transistors in the OFF-state memory cell and the ON/OFF controllable memory cell are of the same conductivity type, a simpler configuration than that including transistors of different conductivity types is achieved.

In the semiconductor memory device of the fourteenth aspect of the present invention, since the transistors in the OFF-state memory cell and the ON/OFF controllable memory cell include N-channel transistors and P-channel transistors and each of the columns includes the transistors of the same conductivity type, it can be manufactured by using a substrate in which N-channel transistors and P-channel transistors are formed in advance.

In the semiconductor memory device of the fifteenth aspect of the present invention, a plurality of memory cells in the first and second columns are programmed with reverse data which are opposite to the desired data so that more than half of the N-channel transistors in the first column may be ON/OFF controllable and further the outputted reverse data are inverted by the data inverting means, to obtain the desired data. Moreover, since the electric power for turning on the transistors is reduced, the semiconductor memory device which is capable of obtaining the desired data with lower power consumption can be provided. Furthermore, even when the source-drain capacitance of the P-channel transistor increases so that the P-channel transistor of less current-carrying capability may have as much current-carrying capability as the N-channel transistor has, a current flow in the P-channel transistor can be prevented. Therefore, it is possible to provide a semiconductor memory device which prevents reduction in speed of access to the memory cells due to large capacity of the P-channel transistor regarded as load capacity.

The sixteenth aspect of the present invention is suitably applied to a semiconductor memory device which includes both the column pair programmed with the desired data and the column pair programmed with the reverse data since the data inverting means inverts the reverse data only when the column pair programmed with the reverse data is selected.

In the semiconductor memory device of the seventeenth aspect of the present invention, since each of the transistors in the OFF-fixed memory cells has the control electrode which is not connected to the word line but connected to the prescribed potential to always keep the transistor in an OFF state, the load capacity across the word line is reduced and thereby high-speed access to the memory cell is achieved.

In the semiconductor memory device of the eighteenth aspect of the present invention, since each of the transistors in the OFF-fixed memory cells has the control electrode which is not connected to the word line but connected to the prescribed potential to always keep the transistor in an OFF state and two main current electrodes neither of which is connected to a bit line, the load capacity across the word line and the bit line are reduced and thereby high-speed access to the memory cell is achieved.

In the semiconductor memory device of the nineteenth aspect of the present invention, since the N-channel transistors are NMOS transistors formed as basic cell units of CMOS gate array and the P-channel transistors are PMOS transistors formed as basic cell units of CMOS gate array, a semiconductor memory device of high integration is achieved.

In the semiconductor memory device of the twentieth aspect of the present invention, since the transistor has the control electrode which is not connected to the word line but connected to the prescribed potential to always keep the transistor in an OFF state and two main current electrodes neither of which is connected to the bit line, a memory cell which has lower load capacity across the word line and the bit line and is always kept in an OFF state can be achieved.

Accordingly, an object of the present invention is to provide a semiconductor memory device which allows reduction in power consumption by cutting the number of ON/OFF controllable memory cells and to provide a semiconductor memory device which ensures high-speed access to the memory cells by suppressing application of load (charge) capacity as much as possible to the bit lines and word lines in the OFF-state memory cells.

These and other objects, features, aspects and advantages of the present invention will become more apparent from the following detailed description of the present invention when taken in conjunction with the accompanying drawings.

BRIEF DESCRIPTION OF THE DRAWINGS

FIG. 18 illustrates an operation of a decoder;

DESCRIPTION OF THE PREFERRED EMBODIMENTS

The First Preferred Embodiment:
< A-1. Configuration of ROM 1000 >

Figure 1:
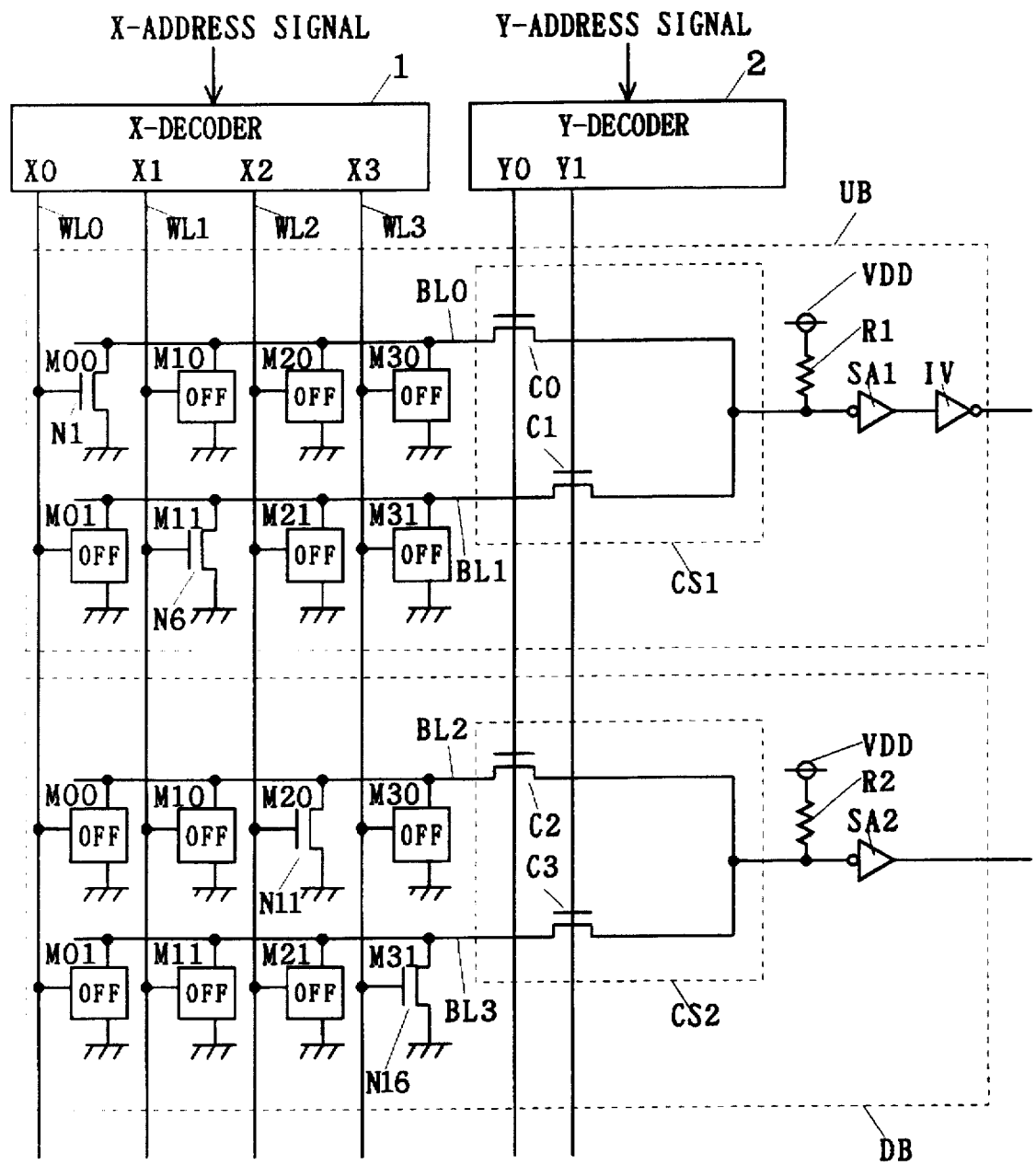
FIG. 1 is a circuit diagram of a semiconductor memory device in accordance with a first preferred embodiment of the present invention.
Figure 2:
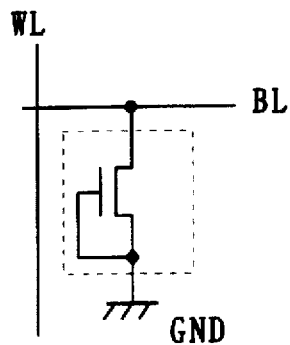
FIGS. 2 to 7 are diagrams showing examples of configuration of OFF-state memory cells.

FIG. 1 is a circuit diagram of a ROM (Read Only Memory) 1000, which is a semiconductor memory device in accordance with the first preferred embodiment of the present invention. The ROM 1000 has an improved configuration corresponding to the first background art as shown in FIGS. 25 to 29.

In the ROM 1000 of FIG. 1, four word lines WL0, WL1, WL2 and WL3 and two pairs of bit lines, one pair of bit lines BL0 and BL1 and the other pair of bit lines BL2 and BL3, are crossed.

The four word lines WL0, WL1, WL2 and WL3 are connected to four outputs X0, X1, X2 and X3 of an X-decoder 1, respectively, which specifies an X-address.

The bit lines BL0 and BL1 are connected to the respective source electrodes of NMOS transistors C0 and C1. The drain electrodes of NMOS transistors C0 and C1 are connected in common to an input of an inverting sense amplifier SA1. An output of the inverting sense amplifier SA1 is connected to an input of an inverter circuit IV.

The NMOS transistors C0 and C1 serve as a column selector CS1. The input of the inverting sense amplifier SA1 is connected to a power supply potential VDD through a pull-up resistor R1.

Similarly, the bit lines BL2 and BL3 are connected to the respective source electrodes of NMOS transistors C2 and C3, and the drain electrodes of NMOS transistors C2 and C3 are connected in common to an input of an inverting sense amplifier SA2. The NMOS transistors C2 and C3 serve as a column selector CS2. The input of the inverting sense amplifier SA2 is connected to a power supply potential VDD through a pull-up resistor R2.

The gate electrodes of NMOS transistors C0 and C2 are connected to an output Y0 of a Y-decoder 2 which specifies a Y-address and the NMOS transistors C0 and C2 operate in common in accordance with a signal outputted from the output Y0 of the Y-decoder 2, and therefore the bit lines BL0 and BL2 also operate in common. The gate electrodes of NMOS transistors C1 and C3 are connected to an output Y1 of the Y-decoder 2 which specifies a Y-address and the NMOS transistors C1 and C3 operate in common in accordance with a signal outputted from the output Y1 of the Y-decoder 2, and therefore the bit lines BL1 and BL3 also operate in common.

Accordingly, eight addresses can be specified with the word lines WL0, WL1, WL2 and WL3 and the bit lines BL0, BL1, BL2 and BL3, and two memory cells are provided at each address and individually programmed.

For example, assuming that reference character M00 represents an address of the memory cell which is selected when the output X0 of the X-decoder 1 and the output Y0 of the Y-decoder 2 are activated, in a memory block UB (referred to as "upper block") consisting of the word lines WL0 to WL3 and the bit lines BL0 and BL1, addresses of the memory cells in the upper column consisting of word lines WL0 to WL3 and bit lines BL0 are represented by reference characters M00, M10, M20 and M30 from the left-hand side and addresses of the memory cells in the lower column consisting of the word lines WL0 to WL3 and the bit lines BL1 are represented by reference characters M01, M11, M21 and M31 also from the left-hand side. The same rule applies correspondingly to a memory block DB (referred to as "lower block") consisting of the word lines WL0 to WL3 and the bit lines BL2 and BL3. For the convenience of discussion, the memory cell located at the address M00 is referred to as a memory cell M00.

< A-2. Programming >

In the ROM 1000 of FIG. 1, memory cells each including an NMOS transistor of which the drain electrode is connected to one of the bit lines, the source electrode is connected to the ground potential (GND) and the gate electrode is connected to one of the word lines and which is controllable in ON/OFF of a main current by ON/OFF operation of the gate electrode (referred to as "ON/OFF controllable memory cells" hereinafter) and memory cells each of which has no main current (direct current) path between the bit line and the ground potential GND, regardless of the potential of the word line, (referred to as "OFF-state memory cells" hereinafter are mixed. Programming of the ROM 1000 is made by combination of the ON/OFF controllable memory cells and the OFF-state memory cells.

In the ROM 1000 of FIG. 1, the memory cells M10, M20, M30, M01, M21 and M31 of the upper block UB and the memory cells M00, M10, M30, M01, M11 and M21 of the lower block DB are the OFF-state memory cells.

Now, the OFF-state memory cell will be discussed, with reference to FIGS. 2 to 7. The first configuration of the OFF-state memory cell shown in FIG. 2 includes an NMOS transistor in which the gate electrode is not connected to the word line WL but connected to the ground potential GND, being fixed into an OFF state. This configuration enables reduction of load (charge) capacity of the gate electrode to be applied to the word line WL and accordingly ensures speeding-up of signal transmission of the word line WL.

Figure 3:
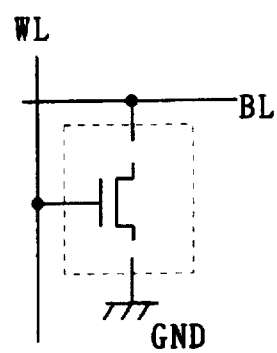

The second configuration of the OFF-state memory cell shown in FIG. 3 includes an NMOS transistor in which the gate electrode is connected to the word line WL, the drain electrode is not connected to the bit line BL, being in an open-state, and the source electrode is not connected to the ground potential GND, being in the open-state. This configuration enables reduction of load (charge) capacity of the drain electrode to be applied to the bit line BL and accordingly ensures speeding-up of signal transmission of the bit line BL.

Figure 4:
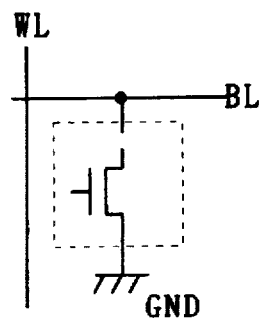

The third configuration of the OFF-state memory cell shown in FIG. 4 includes an NMOS transistor in which the source electrode is connected to the ground potential GND, the gate electrode is not connected to the word line WL, being in the open-state, and the drain electrode is not connected to the bit line BL, being in the open-state. This configuration enables reduction of load (charge) capacity of the gate electrode to be applied to the word line WL and that of the drain electrode to be applied to the bit line BL, and accordingly ensures speeding-up of signal transmission of the word line WL and the bit line BL.

Figure 5:
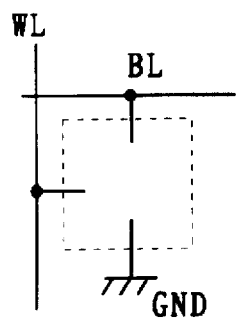

The fourth configuration of the OFF-state memory cell shown in FIG. 5 includes no NMOS transistor. This configuration, where neither gate electrode nor drain electrode is provided, enables further reduction of load (charge) capacity of the gate electrode to be applied to the word line WL and that of the drain electrode to be applied to the bit line BL, and accordingly ensures further speeding-up of signal transmission of the word line WL and the bit line BL.

Figure 6:
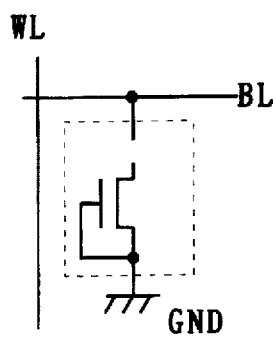

The fifth configuration of the OFF-state memory cell shown in FIG. 6 includes an NMOS transistor in which the gate electrode is not connected to the word line WL but connected to the ground potential GND, being fixed into the OFF state, and the drain electrode is not connected to the bit line BL, being in the open-state. This configuration enables reduction of load (charge) capacity to be applied to the word line WL and the bit line BL and accordingly ensures speeding-up of signal transmission of the word line WL and the bit line BL.

Figure 7:
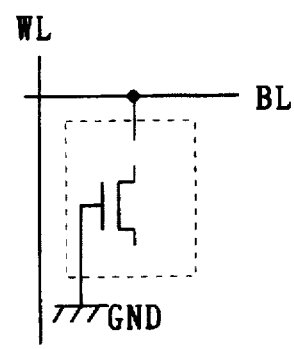

The sixth configuration of the OFF-state memory cell shown in FIG. 7 includes an NMOS transistor in which the gate electrode is not connected to the word line WL but connected to the ground potential GND, being fixed into the OFF state, and the drain electrode is not connected to the bit line BL, being in the open-state, and the source electrode is not connected to the ground potential GND, being in the open-state. This configuration enables reduction of load (charge) capacity to be applied to the word line WL and the bit line BL and accordingly ensures speeding-up of signal transmission of the word line WL and the bit line BL.

Furthermore, although the above discussion has been made on the memory cell including the NMOS transistor, it is natural that the memory cell may include a PMOS transistor. When the PMOS transistor is used in corresponding configurations of FIGS. 2, 6 and 7, the control electrode of PMOS transistor is connected to the power supply potential (VDD), not to the ground potential GND, being fixed into the OFF state.

Figure 26:
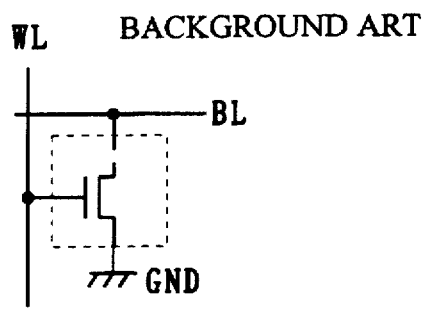
FIGS. 26 and 27 are diagrams showing examples of configuration of OFF-state memory cells.
Figure 27:
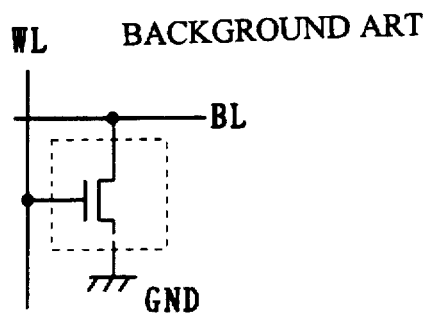
Figure 28:
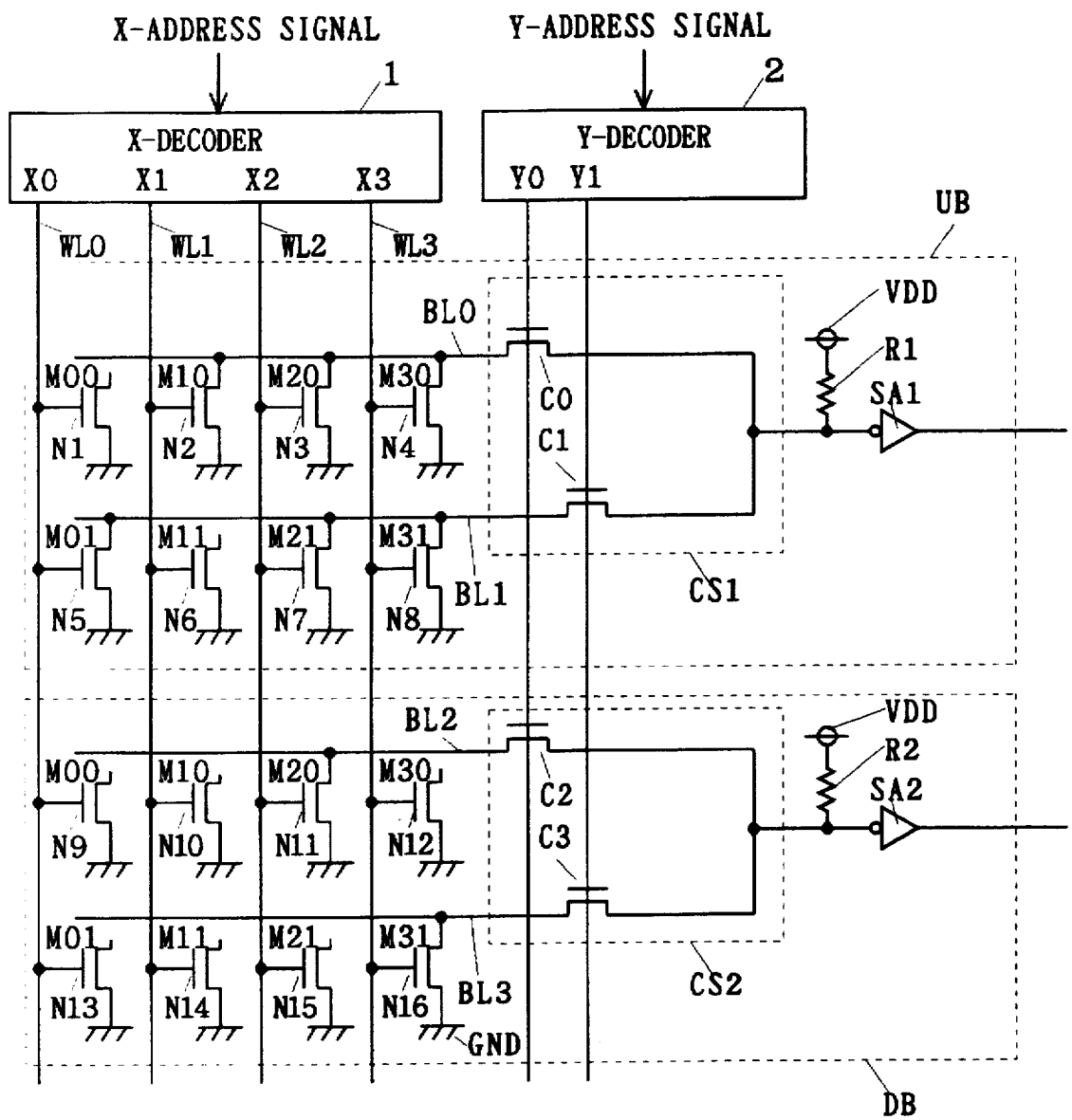
FIGS. 28 and 29 are circuit diagrams of the semiconductor memory devices in the first background art.
Figure 29:
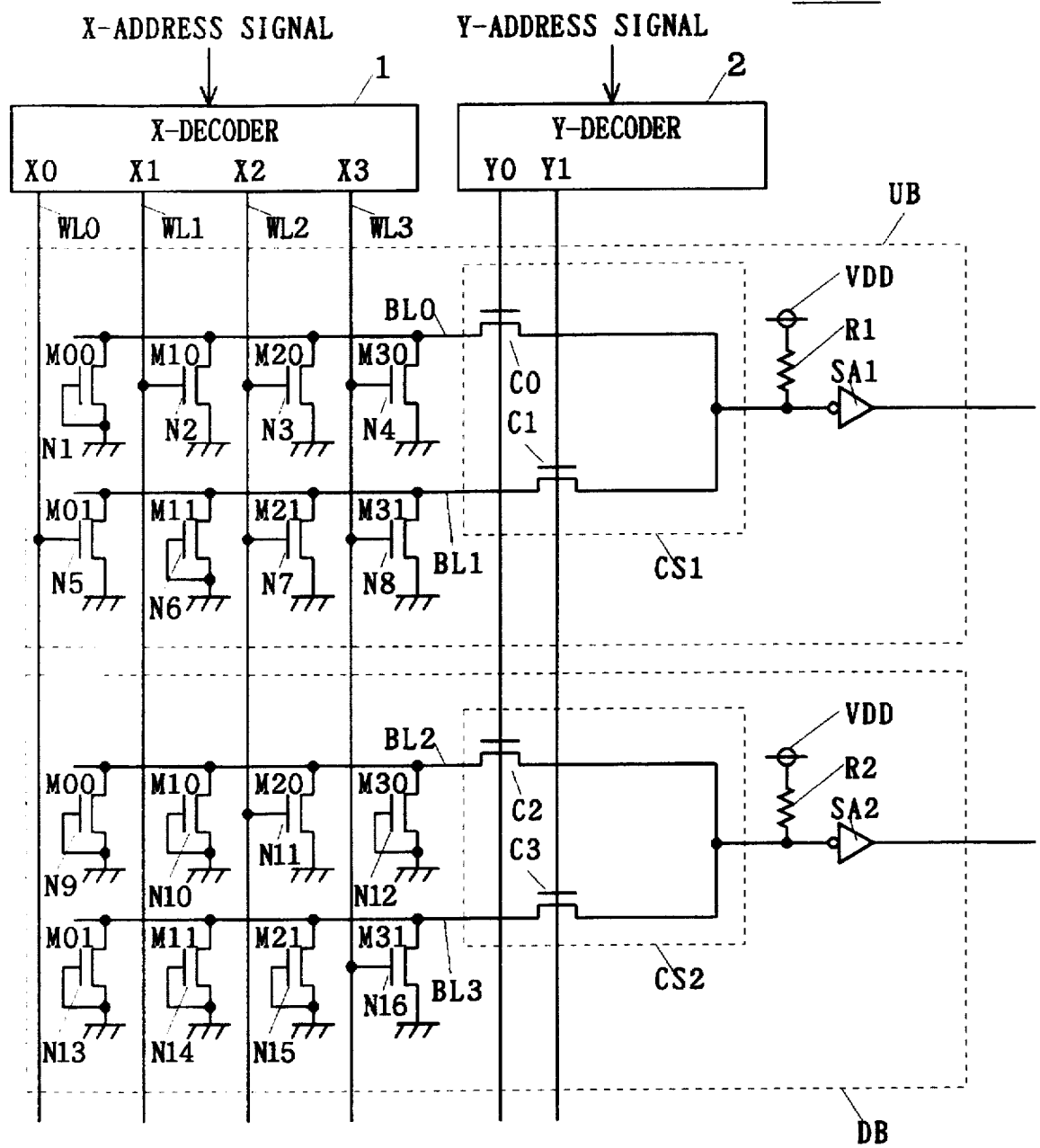

Any one of the first to sixth configurations of OFF-state memory cell or the configurations of FIGS. 26 and 27 may be used in the ROM 1000. A specific example of programming of the ROM 1000 will be discussed hereinafter, taking the case of the first configuration of FIG. 2, with reference to FIG. 8.

Figure 8:
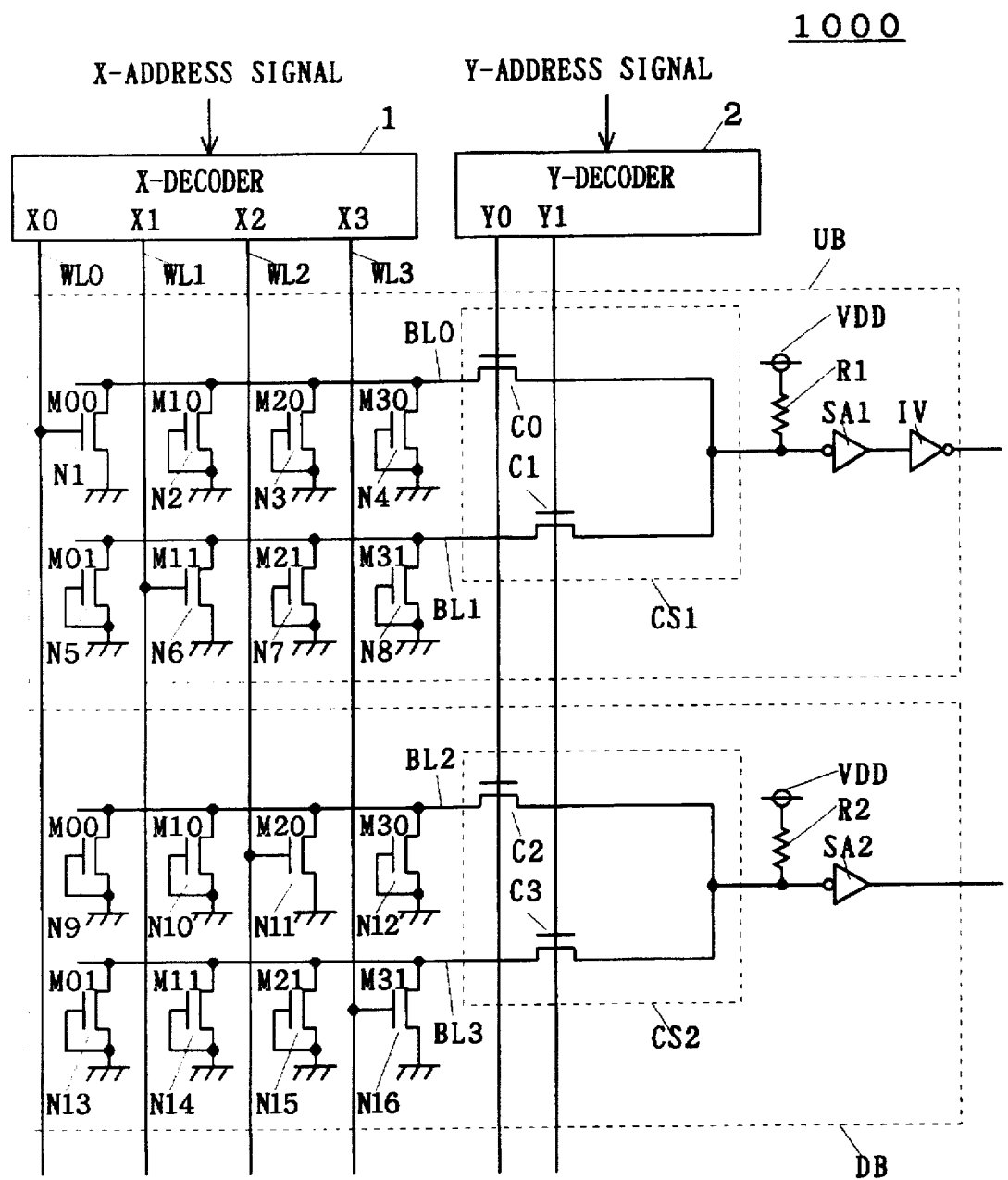
FIG. 8 is a circuit diagram of the semiconductor memory device in accordance with the first preferred embodiment of the present invention.

In the upper column of the upper block UB of FIG. 8, the gate electrode of NMOS transistor N1 of the memory cell M00 is connected to the word line WL0 and the gate electrodes of NMOS transistors of other memory cells are not connected to the word lines but connected to the ground potential GND.

In the lower column of the upper block UB, the gate electrode of NMOS transistor N6 of the memory cell M11 is connected to the word line WL1 and the gate electrodes of NMOS transistors of other memory cells are not connected to the word lines but connected to the ground potential GND.

In the upper column of the lower block DB, the gate electrode of NMOS transistor N11 of the memory cell M20 is connected to the word line WL2 and the gate electrodes of NMOS transistors of other memory cells are not connected to the word lines but connected to the ground potential GND.

In the lower column of the lower block DB, the gate electrode of NMOS transistor N16 of the memory cell M31 is connected to the word line WL3 and the gate electrodes of NMOS transistors of other memory cells are not connected to the word lines but connected to the ground potential GND.

< A-3. Operation of ROM 1000 >

Next, an operation of the ROM 1000 will be discussed. For example, when the output X0 of the X-decoder 1 and the output Y0 of the Y-decoder 2 are activated and the memory cell M00 is selected, a direct current flows between the source and drain of NMOS transistor N1 since the gate electrode of NMOS transistor N1 is connected to the word line WL0 (so connected as to be ON/OFF controllable), and in consequence the input of the inverting sense amplifier SA1 becomes "0" (Low-level). Accordingly, the output of the inverting sense amplifier SA1 becomes "1" (High-level) and an output of the inverter circuit IV becomes "0" (Low-level).

At this time, no direct current flows between the source and drain of NMOS transistor N9 since the gate electrode of NMOS transistor N9 is connected to the ground potential GND (fixed in the OFF state), and in consequence the input of the inverting sense amplifier SA2 becomes "1" (High-level) through the pull-up resistor R2. Accordingly, the output of the inverting sense amplifier SA2 becomes "0" (Low-level).

On the other hand, when the output X1 of the X-decoder 1 and the output Y0 of the Y-decoder 2 are activated and the memory cell M10 is selected, no direct current flows between the source and drain of NMOS transistor N2 since the gate electrode of NMOS transistor N2 is connected to the ground potential GND and in consequence the input of the inverting sense amplifier SA1 becomes "1" through the pull-up resistor R1. Accordingly, the output of the inverting sense amplifier SA1 becomes "0" and the output of the inverter circuit IV becomes "1".

At this time, no direct current flows between the source and drain of NMOS transistor N10 since the gate electrode of NMOS transistor N10 is connected to the ground potential GND, and in consequence the input of the inverting sense amplifier SA2 becomes "1" through the pull-up resistor R2. Accordingly, the output of the inverting sense amplifier SA2 becomes "0".

Thus, in the upper block UB of the ROM 1000, an output of "1" is obtained at the time of selection of the memory cells in which the gate electrode of NMOS transistor is connected to the ground potential GND. That is opposite to the case of the ROM 200.

In the upper block UB of the ROM 1000 of FIG. 1, there are six memory cells programmed to produce an output of "1", i.e., M10, M20, M30, M01, M21 and M31. If access to every memory cell is made with equal probability, the probability of access to the memory cell programmed to produce an output of "1" is 6/8 (75%). No direct current flows, however, when one of these memory cells are accessed. On the other hand, there are two memory cells programmed to produce an output of "0", i.e., M00 and M11. When one of these two memory cells is accessed, a direct current flows, but the probability of access to these memory cells is 2/8 (25%). The probability of direct current flowing is 25%.

Thus, in the upper block UB of the ROM 1000, the memory cells M10, M20, M30, M01, M21 and M31 are programmed to produce an output of "1". That is the same as the case of the background-art ROM 200. The probability of direct current flowing, however, is reduced to one-third of that of the background-art ROM 200, and thereby an operation with lower power consumption is ensured.

On the other hand, since there are two memory cells programmed to produce an output of "1", i.e., M20 and M31 in the lower block DB combining the upper and lower columns, the probability of access to these memory cells is 2/8 (25%) and the probability of direct current flowing is 25%, which is equal to that of the ROM 200.

Furthermore, the upper block UB of the ROM 1000 as discussed above is programmed in the manner opposite to the background-art ROM 200. If the upper block UB of the ROM 1000 is programmed in the same manner as the ROM 200, the probability of direct current flowing would be 75% provided that access to every memory cell is made with equal probability. For this reason, the present invention is applied to the upper block UB in order to reduce the probability of direct current flowing. On the other hand, since the probability of direct current flowing in the lower block DB when programmed in the same manner as the ROM 200 is 25%, there is no need for applying the present invention to the lower block DB.

For example, the lower block DB of the ROM 1000 is programmed in the same manner as the upper block UB of the ROM 200, which is the case where the present invention is not applied. The present invention does not have to be applied to a case where the probability of direct current flowing does not exceed 50% because access to every memory cell is not necessarily made with equal probability, or a case where the degree of a waste of power consumption is negligible even when the probability of direct current flowing exceeds 50%.

Therefore, even if a ROM includes a plurality of columns each of which is programmed so that more than half of memory cells may be the ON/OFF controllable memory cells, it is not necessary to apply the present invention to all the columns.

< A-4. Characteristic Effect >

As discussed above, in the first preferred embodiment, the programming of the memory cells in the upper block UB is reversely made, and therefore, the reverse data, i.e., the reverse equivalent of the desired data are obtained when one of the memory cells in the upper block UB is selected. With the inverter circuit IV additionally provided at the output of the inverting sense amplifier SA1, the reverse data are further inverted, thus eventually obtaining the desired data. Moreover, this configuration allows reduction of the probability of direct current flowing in a transistor constituting a memory cell, and ensures an operation with low power consumption.

The Second Preferred Embodiment:

< B-1. Configuration of ROM 2000 >

Figure 30:
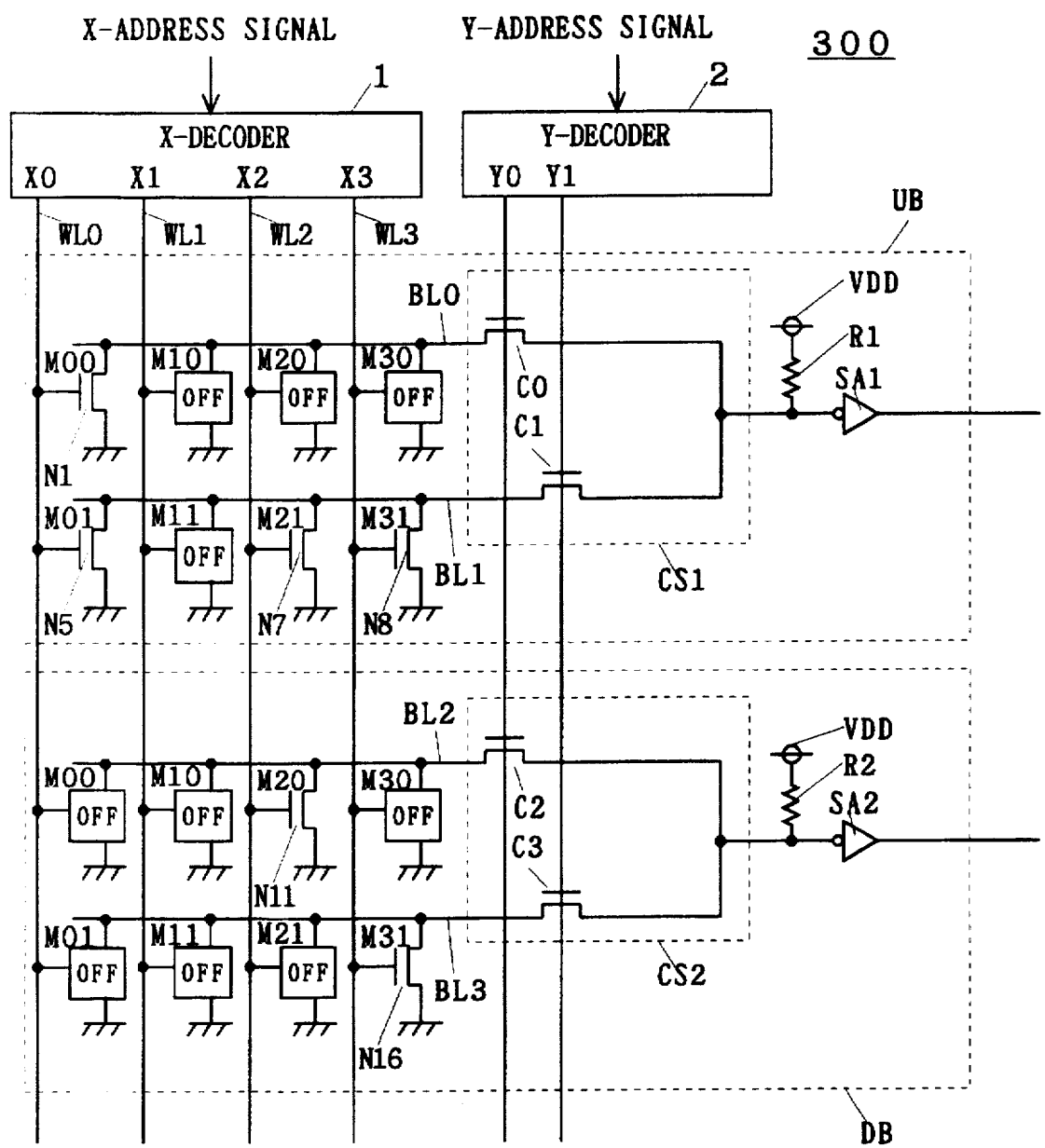
FIGS. 30 and 31 are circuit diagrams of semiconductor memory devices in a second background art.

In the upper column of the upper block UB of the background-art ROM 300 shown in FIG. 30, if access to every memory cell is made with equal probability, the probability of access to the memory cells programmed to produce an output of "1" is 1/4 (25%) and the probability of direct current flowing is 25%. In the lower column of the upper block UB, there are three memory cells programmed to produce an output of "1", i.e., M01, M21 and M31. If access to every memory cell is made with equal probability, the probability of access to the memory cells programmed to produce an output of "1" is 3/4 (75%) and the probability of direct current flowing is 75%. Therefore, in the upper block UB on the whole combining the upper and lower columns, the probability of direct current flowing is 50%.

In this case, the probability of direct current flowing remains 50% even if the programming of the memory cells in the upper block UB is reversely made and the inverter circuit is additionally provided at the output of inverting sense amplifier SA1 in the same manner as the ROM 1000 of FIG. 1, and accordingly no effect of reducing power consumption is produced.

Figure 9:
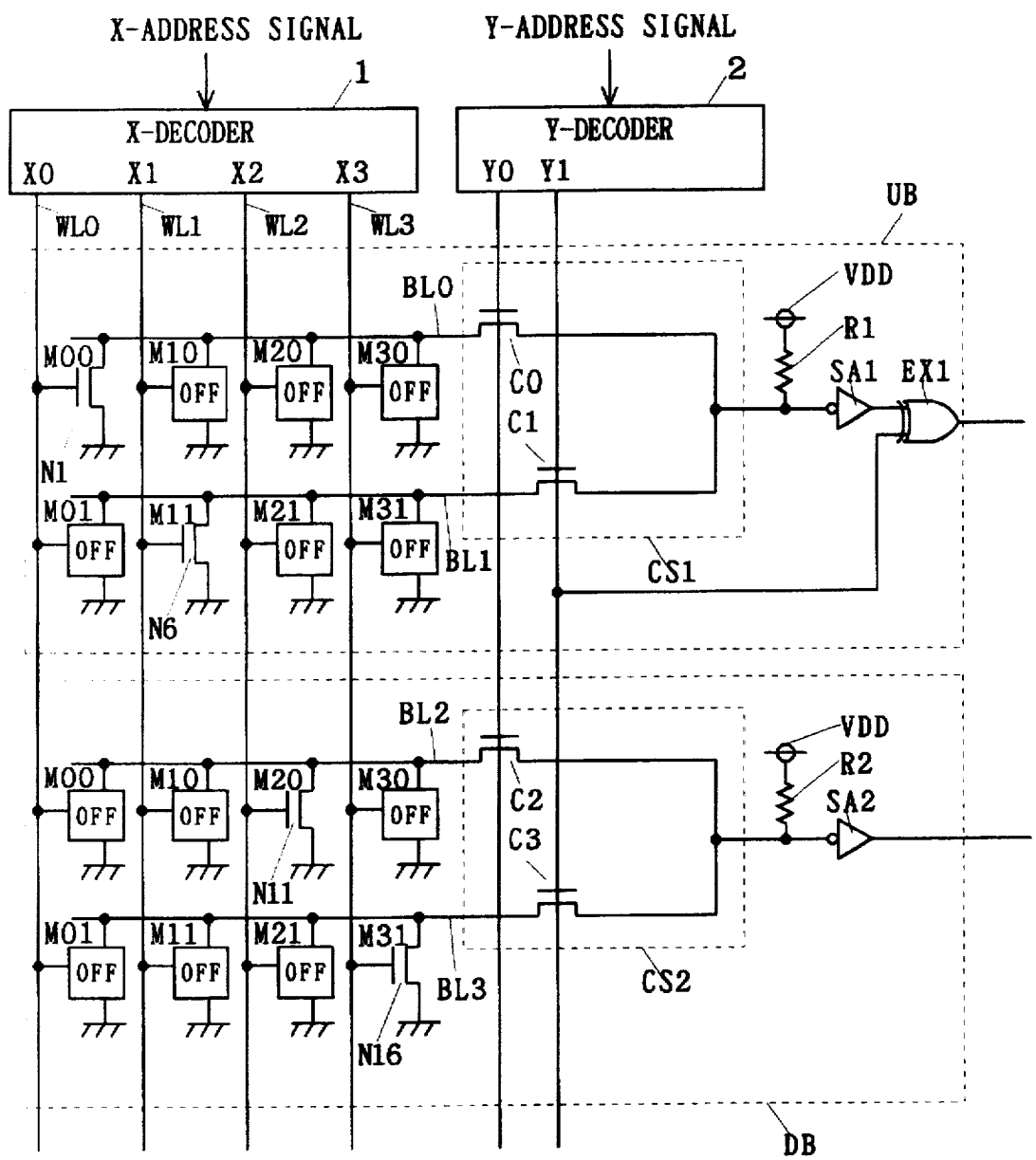
FIGS. 9 and 10 are circuit diagrams showing a semiconductor memory device in accordance with a second preferred embodiment of the present invention.

FIG. 9 is a circuit diagram of a ROM 2000, which is a semiconductor memory device in accordance with the second preferred embodiment of the present invention. In the ROM 2000 of FIG. 9, the same elements as the ROM 1000 of FIG. 1 are given the same reference characters and duplicate discussion will be omitted.

FIG. 9 shows that the output of the inverting sense amplifier SA1 is connected to one of two inputs of an exclusive OR circuit EX1 and the other input of the exclusive OR circuit EX1 is connected to the output Y1 of the Y-decoder 2, being provided with a control signal of inversion/non-inversion.

< B-2. Programming >

Any one of the first to fourth configurations of OFF-state memory cell may be used in the ROM 2000. A specific example of programming of the ROM 2000 will be discussed hereinafter, taking the case of the first configuration of FIG. 2, with reference to FIG. 10.

Figure 31:
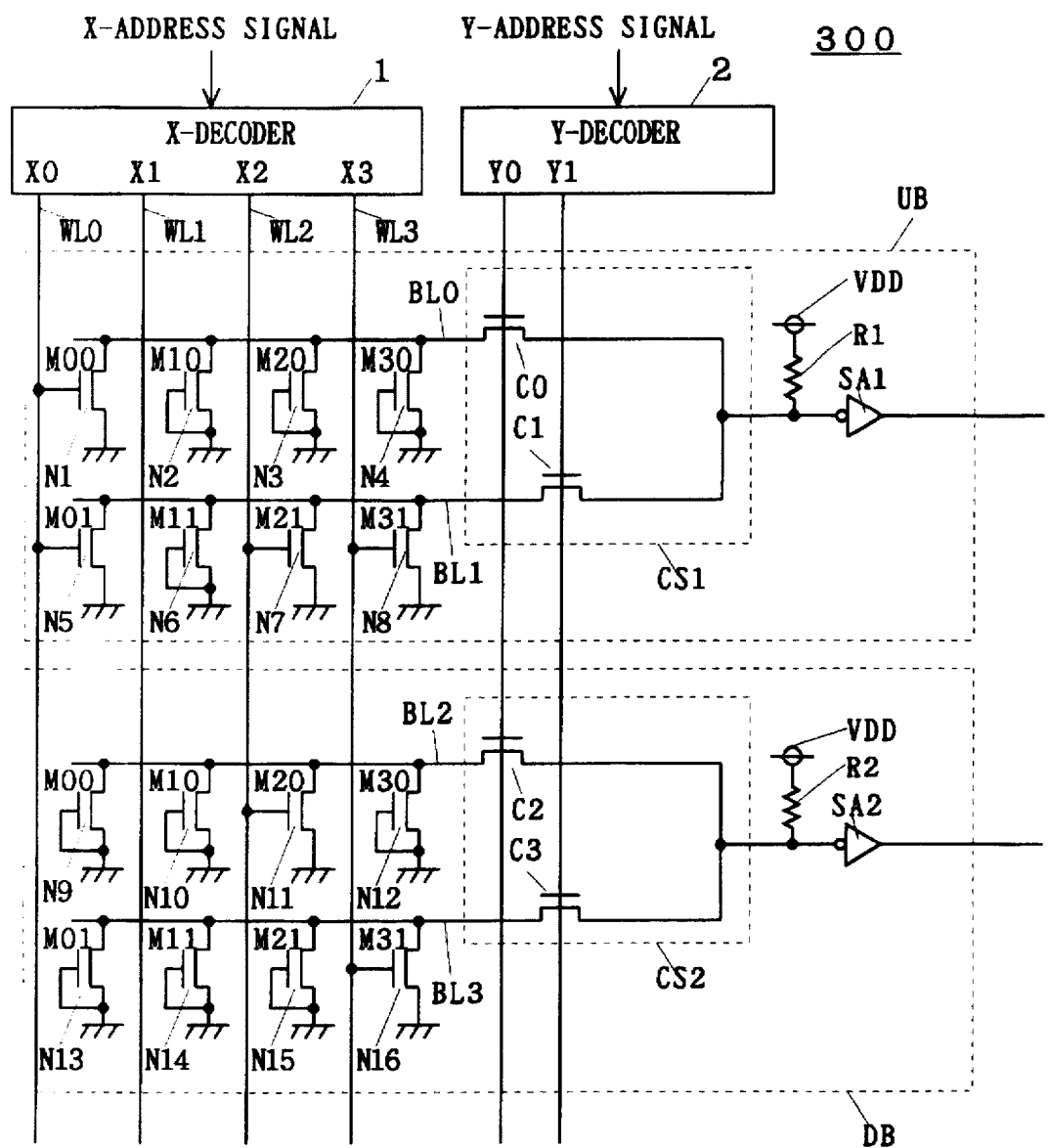

In the upper column of the upper block UB of FIG. 31, where gate electrodes of NMOS transistors other than the NMOS transistor N1 in the memory cell M00 are each connected to the ground potential GND (fixed into the OFF state), the probability of direct current flowing when the memory cells are selected in the column is 25%. Hence, the column is also used in the ROM 2000 of FIG. 10.

On the other hand, in the lower column of the upper block UB of FIG. 31, the gate electrode of NMOS transistor N6 of the memory cell M11 is connected to the ground potential GND and the gate electrodes of NMOS transistors of other memory cells are connected to the word lines (to be ON/OFF controllable). In this column, the probability of direct current flowing is 75%. In the ROM 2000 of FIG. 10, the gate electrode of NMOS transistor N6 of the memory cell M11 is connected to the word line and the gate electrodes of NMOS transistors of other memory cells are connected to the ground potential GND (fixed in the OFF state), to thereby reverse the probability of direct current flowing when the memory cells are selected.

Figure 10:
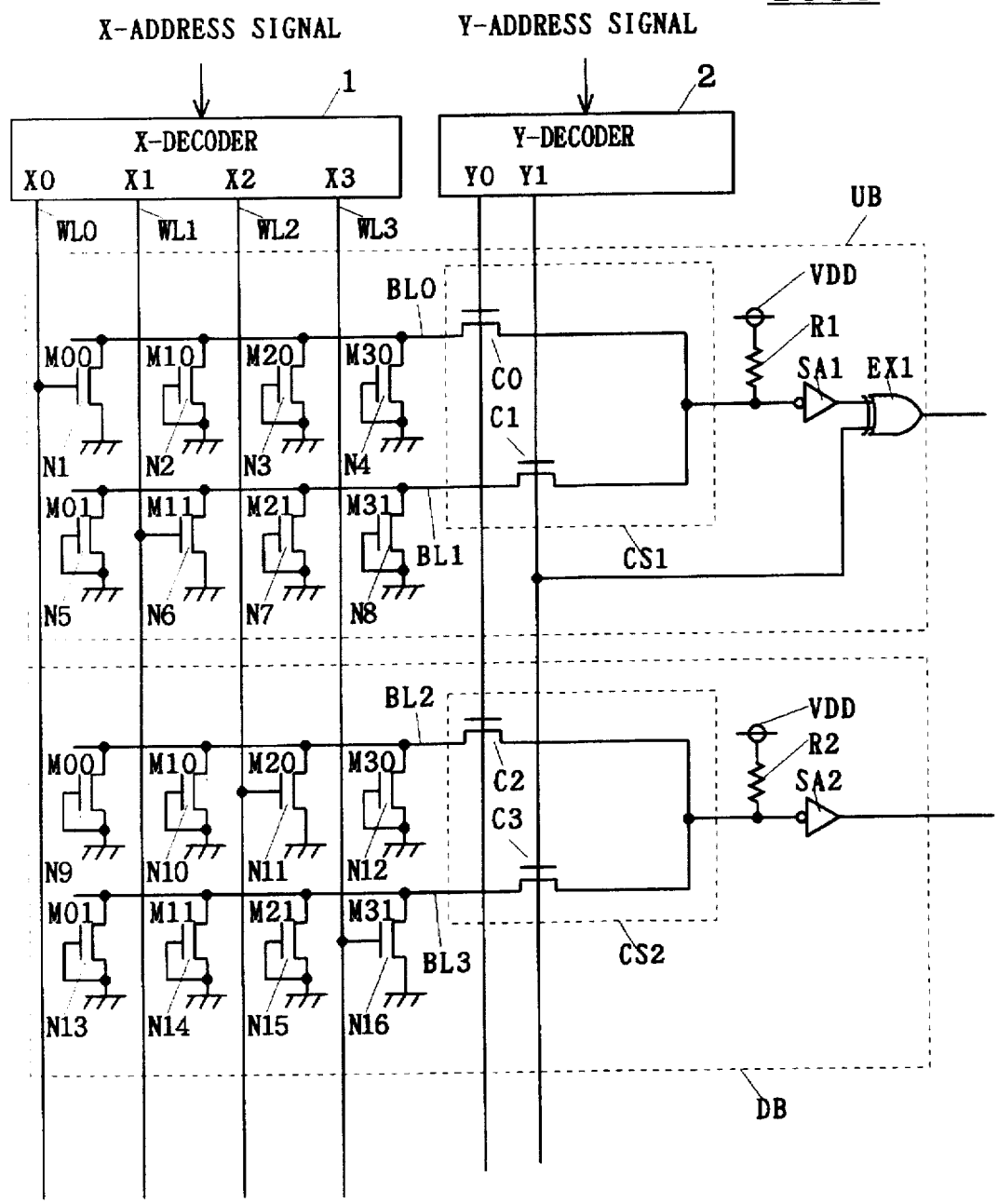

Furthermore, in the lower block DB of FIG. 31, since the probability of direct current flowing is 25% in both the upper and lower columns, the lower block DB of FIG. 31 is also used in FIG. 10.

< B-3. Operation of ROM 2000 >

Next, an operation of the ROM 2000 will be discussed. When the output Y0 of the Y-decoder 2 is activated and the bit line BL0 is selected, in other words, the upper column of the upper block UB is selected, the exclusive OR circuit EX1 does not act as an inverter and outputs the output of the inverting sense amplifier SA1 without inversion.

On the other hand, when the output Y1 of the Y-decoder 2 is activated and the bit line BL1 is selected, in other words, the lower column of the upper block UB is selected, the exclusive OR circuit EX1 acts as an inverter to invert the output of the inverting sense amplifier SA1 to be outputted.

Therefore, in the lower column of the upper block UB, when the memory cell M01 is selected, for example, no current flows between its source and drain and the input of the inverting sense amplifier SA1 becomes "1" through the pull-up resistor R1. The output of the inverting sense amplifier SA1 accordingly becomes "0" and the exclusive OR circuit EX1, receiving it, acts as an inverter to obtain an output of "1".

When the memory cell M11 is selected, a current flows between its source and drain and the input of the inverting sense amplifier SA1 becomes "0". The output of the inverting sense amplifier SA1 accordingly becomes "1" and the exclusive OR circuit, receiving it, acts as an inverter to obtain an output of "0".

< B-4. Characteristic Effect >

As discussed above, in the semiconductor memory device of the second preferred embodiment, the programming of the memory cells is reversely made in a column where the probability of direct current flowing is more than 50% when the memory cells are selected, and the output of the inverting sense amplifier SA1 is inverted by the exclusive OR circuit EX1 which is connected thereto only when that column is selected. That prevents an evil due to an indiscriminate program reversal for the memory cells in a column where the probability of direct current flowing is less than 50% when the memory cells are selected. Having the above configuration, the second preferred embodiment allows reduction of the probability of direct current flowing in the transistors constituting the memory cells, and thereby ensures an operation with low power consumption.

The Third Preferred Embodiment:

< C-1. Configuration of ROM 3000 >

Now, a 16-word ROM 3000 which uses four columns for 1-bit data output will be discussed, referring to FIG. 11.

Figure 32:
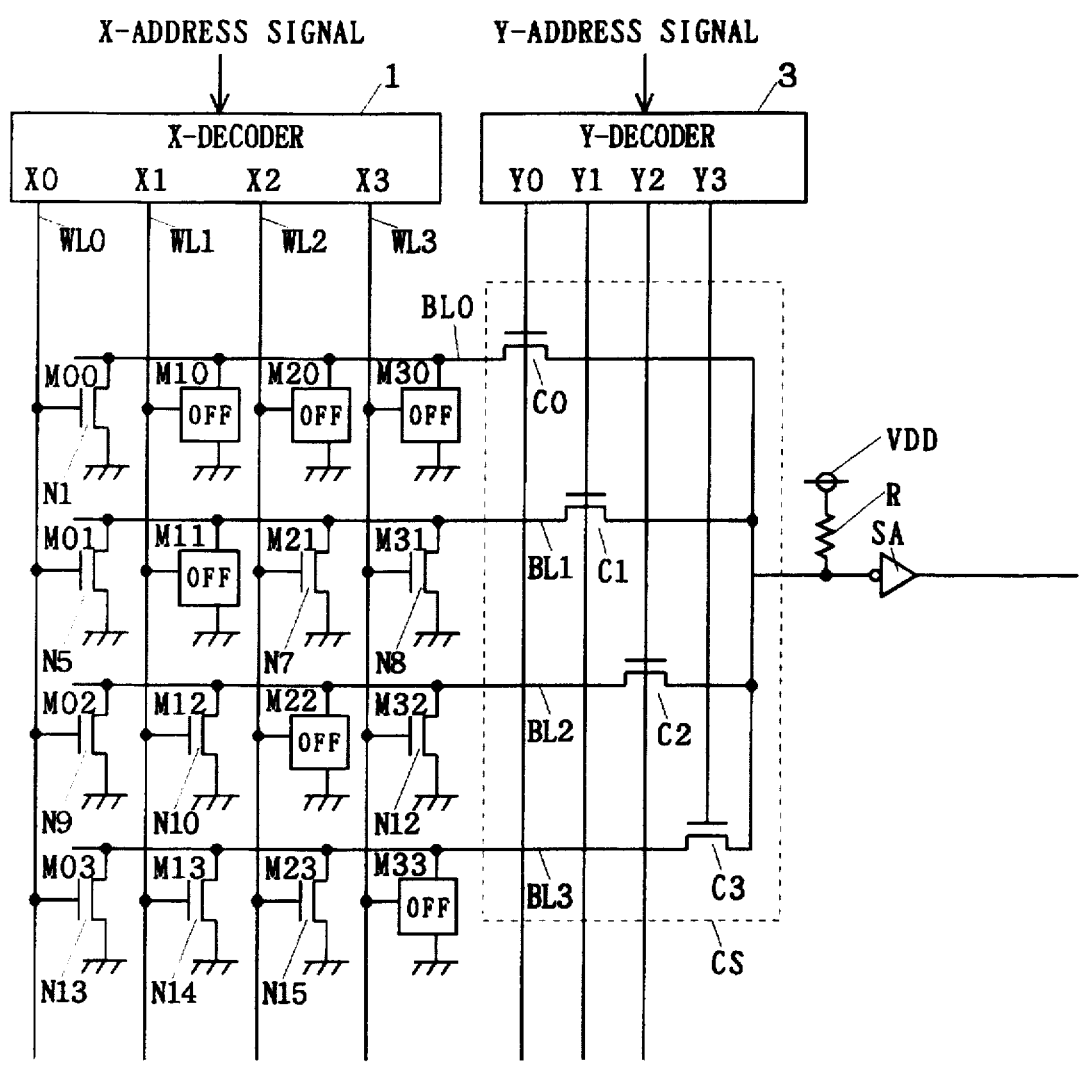
FIGS. 32 and 33 are circuit diagrams of semiconductor memory devices in a third background art.

In the ROM 400 of FIG. 32, if access to every memory cell in the first column is made with equal probability, the probability of access to the memory cell programmed to produce an output of "1" is ¼ (25%) and the probability of direct current flowing is 25%. In the second column, if access to every memory cell is made with equal probability, the probability of access to the memory cells programmed to produce an output of "1" is ¾ (75%) since there are three memory cells programmed to produce an output of "1", i.e., M01, M21 and M31, and the probability of direct current flowing is 75%.

In the third column, if access to every memory cell is made with equal probability, the probability of access to the memory cells programmed to produce an output of "1" is ¾ (75%) since there are three memory cells programmed to produce an output of "1", i.e., M02, M12 and M32, and the probability of direct current flowing is 75%. In the fourth column, if access to every memory cell is made with equal probability, the probability of access to the memory cells programmed to produce an output of "1" is ¾ (75%) since there are three memory cells programmed to produce an output of "1", i.e., M03, M13 and M23, and the probability of direct current flowing is 75%.

In this case, if the programmings for all of the memory cells in the first to fourth columns are reversely made and the inverter circuit is additionally provided at the output of the inverting sense amplifier SA1 in the same manner as the ROM 1000 of FIG. 1, the probability of direct current flowing in the first column becomes 75% and that of the second to fourth columns each becomes 25%. The probability of direct current flowing of sixteen memory cells on the whole is 37.5% (6/16), remaining plenty of room for being reduced.

Figure 11:
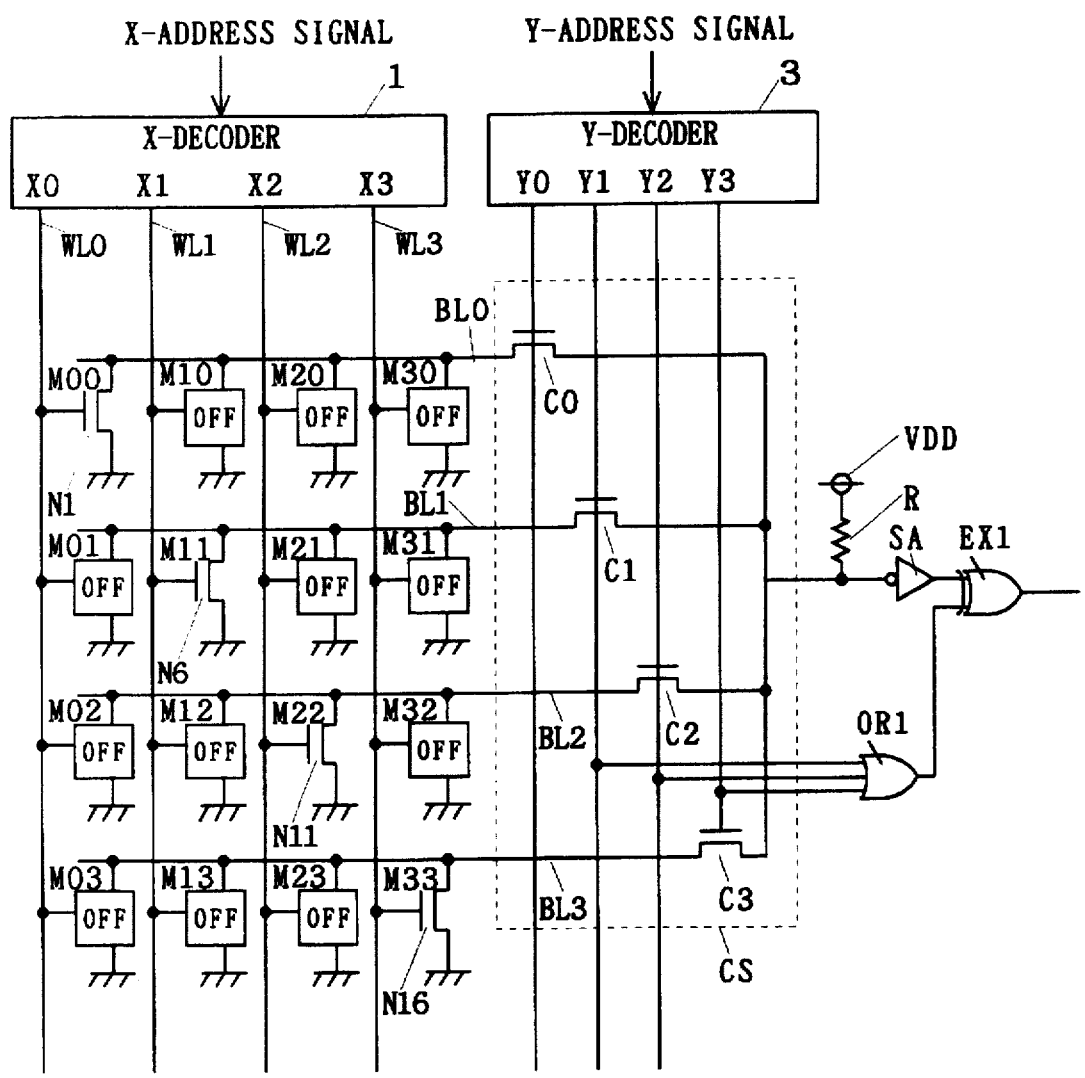
FIGS. 11 and 12 are circuit diagrams showing a semiconductor memory device in accordance with a third preferred embodiment of the present invention.

FIG. 11 is a circuit diagram of a ROM 3000, which is a semiconductor memory device in accordance with the third preferred embodiment of the present invention. In the ROM 3000 of FIG. 11, four word lines WL0, WL1, WL2 and WL3 and four bit lines BL0, BL1, BL2 and BL3 are crossed. The four word lines WL0, WL1, WL2 and WL3 are connected to four outputs X0, X1, X2 and X3 of the X-decoder 1, respectively, which specifies an X-address.

The bit lines BL0, BL1, BL2 and BL3 are connected to the respective source electrodes of NMOS transistors C0, C1, C2 and C3. The drain electrodes of NMOS transistors C0, C1, C2 and C3 are connected in common to an input of the inverting sense amplifier SA. The NMOS transistors C0, C1, C2 and C3 serve as a column selector CS. The input of the inverting sense amplifier SA is connected to a power supply potential VDD through a pull-up resistor R.

The gate electrodes of NMOS transistors C0, C1, C2 and C3 are connected to outputs Y0, Y1, Y2 and Y3 of a Y-decoder 3, respectively, which specifies a Y-address.

A memory cell line consisting of the word lines WL0, WL1, WL2 and WL3 and the bit line BL0 is referred to as "the first column" and memory cells therein are represented by the reference characters M00, M10, M20 and M30 from the left-hand side. Similarly, a memory cell line consisting of the word lines WL0, WL1, WL2 and WL3 and the bit line BL1 is referred to as "the second column" and memory cells therein are represented by the reference characters M01, M11, M21 and M31 from the left-hand side. A memory cell line consisting of the word lines WL0, WL1, WL2 and WL3 and the bit line BL2 is referred to as "the third column" and memory cells therein are represented by the reference characters M02, M12, M22 and M32 from the left-hand side. A memory cell line consisting of the word lines WL0, WL1, WL2 and WL3 and the bit line BL3 is referred to as "the fourth column" and memory cells therein are represented by the reference characters M03, M13, M23 and M33 from the left-hand side.

In the ROM 3000 of FIG. 11, the output of the inverting sense amplifier SA is connected to one of two inputs of the exclusive OR circuit and the other input of the exclusive OR circuit is connected to a three-input OR circuit OR1.

The three inputs of the OR circuit OR1 are connected to the outputs Y1, Y2 and Y3 of the Y-decoder 3 to be given a control signal of inversion/non-inversion.

< C-2. Programming >

In the ROM 3000 shown in FIG. 11, the memory cells M10, M20, M30, M01, M21, M31, M02, M12, M32, M03, M13 and M23 are the OFF-state memory cells.

Any one of the first to fourth configurations of OFF-state memory cell may be used in the ROM 3000. A specific example of programming of the ROM 3000 will be discussed hereinafter, taking the case of the first configuration of FIG. 2, with reference to FIG. 12.

Figure 12:
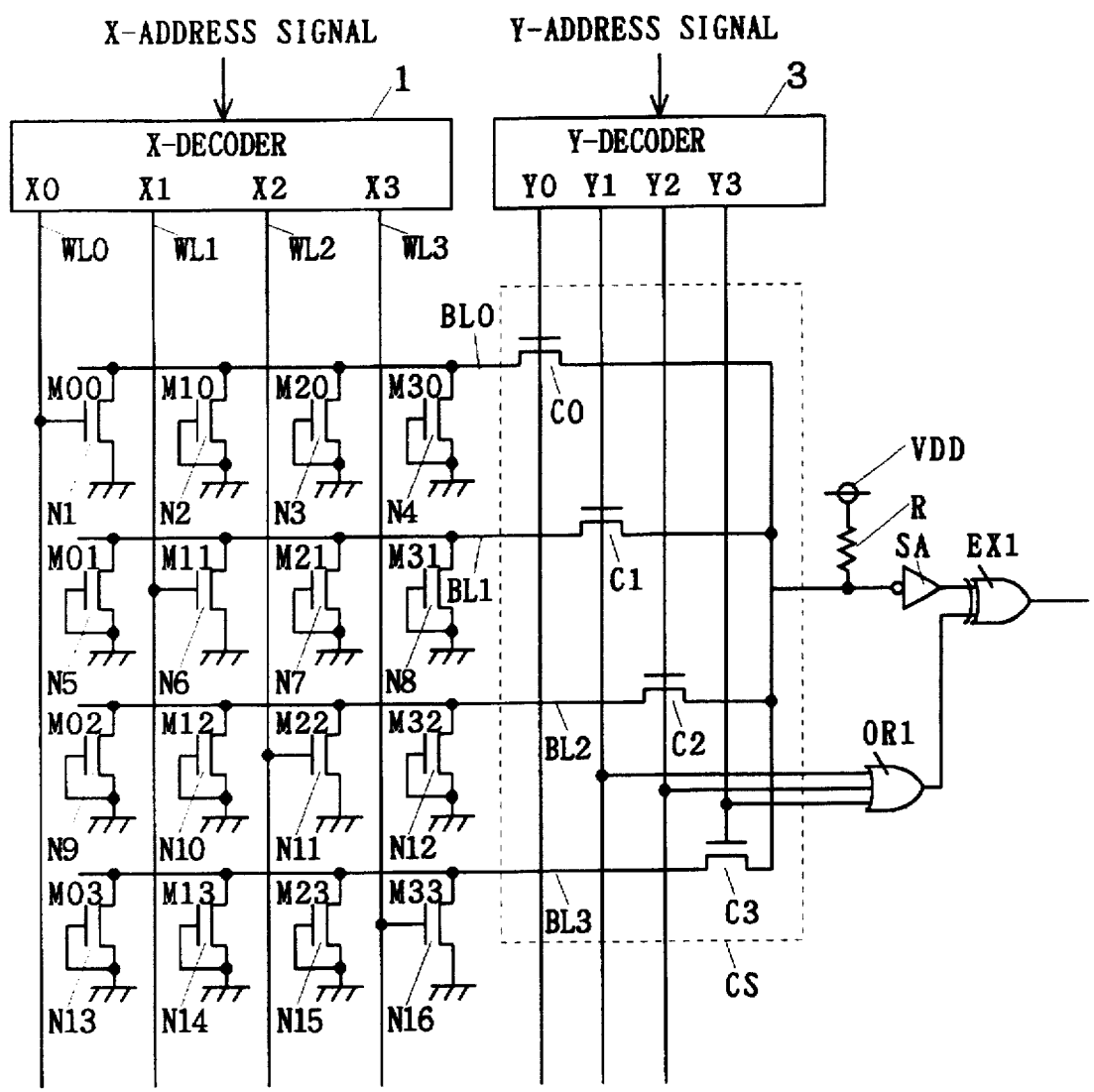
Figure 33:
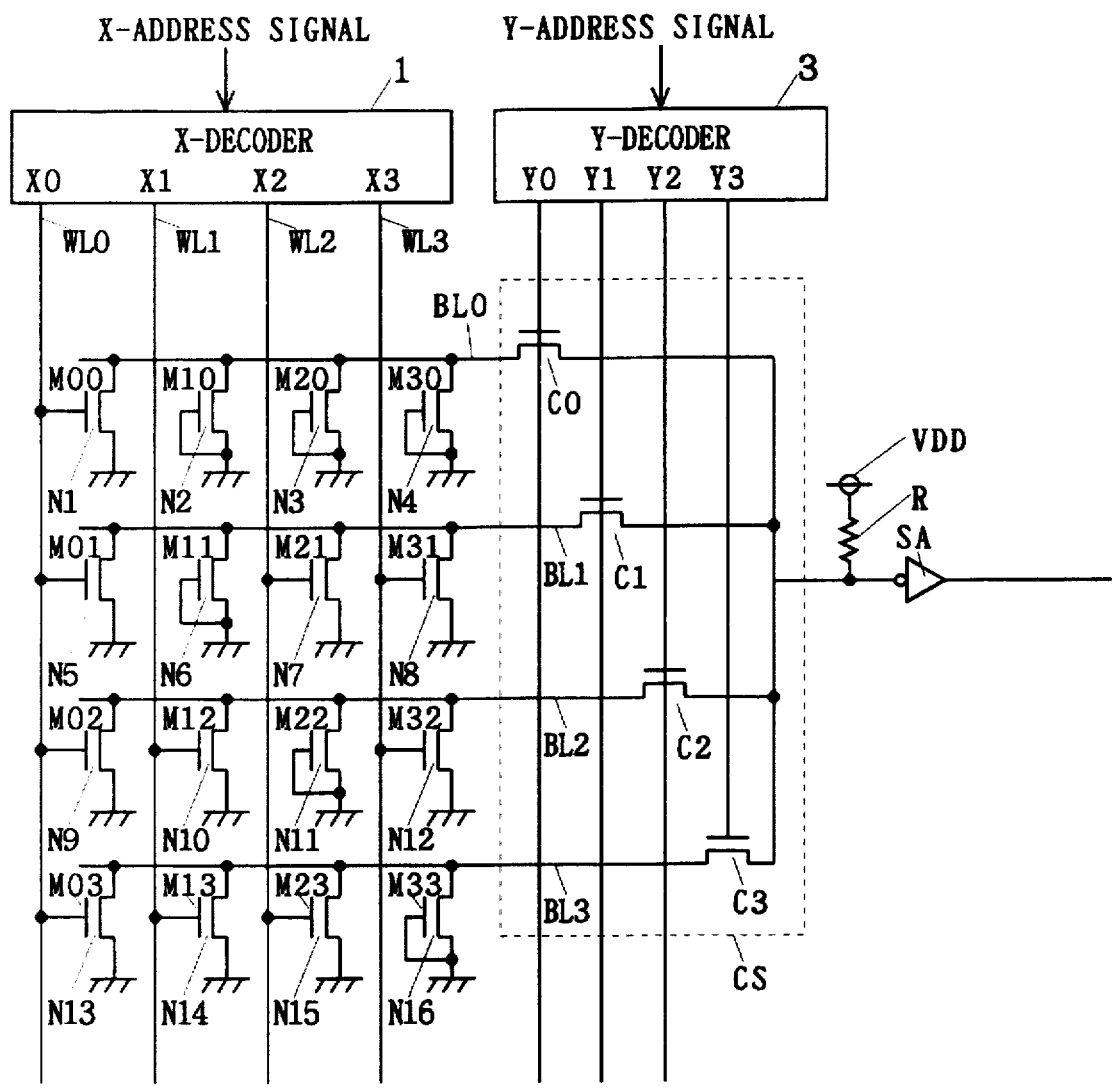

In the first column of the ROM 3000 of FIG. 12, the gate electrode of NMOS transistor N1 of the memory cell M00 is connected to the word line WL0 (to be ON/OFF controllable), and the gate electrodes of NMOS transistors of other memory cells are connected to the ground potential GND (fixed in the OFF state), like the first column of the background-art ROM 400 of FIG. 33.

On the other hand, in the second column, the gate electrode of NMOS transistor N6 of the memory cell M11 is connected to the word line WL1 (to be ON/OFF controllable), and the gate electrodes of NMOS transistors of other memory cells are connected to the ground potential GND (fixed in the OFF state). The programming of the memory cells in the second column is made reversely to that of the second column of the background-art ROM 400.

In the third column, the gate electrode of NMOS transistor N11 of the memory cell M22 is connected to the word line WL2 (to be ON/OFF controllable), and the gate electrodes of NMOS transistors of other memory cells are connected to the ground potential GND (fixed in the OFF state). The programming of the memory cells in the third column is made reversely to that of the third column of the background-art ROM 400. In the fourth column, the gate electrode of NMOS transistor N16 of the memory cell M33 is connected to the word line WL3 (to be ON/OFF controllable), and the gate electrodes of NMOS transistors of other memory cells are connected to the ground potential GND (fixed in the OFF state). The programming of the memory cells in the fourth column is made reversely to that of the fourth column of the background-art ROM 400.

< C-3. Operation of ROM 3000 >

Next, an operation of the ROM 3000 will be discussed. When the output Y0 of the Y-decoder 3 is activated to turn on the transistor C0 acting as a column selector CS and the bit line BL0 is selected, in other words, the first column is selected, the output of the OR circuit OR1 is "0" since the outputs Y0 to Y3 of the Y-decoder 3 are each "0" and accordingly the exclusive OR circuit EX1 does not act as an inverter to output the output of the inverting sense amplifier SA without inversion.

On the other hand, when one of the outputs Y1, Y2 and Y3 of the Y-decoder 3 is activated and one of the bit lines BL1, BL2 and BL3 is selected, the output of the OR circuit OR1 is "1" and accordingly the exclusive OR circuit EX1 acts as an inverter to invert the output of the inverting sense amplifier SA1 to be outputted.

When the memory cell M01 in the second column is selected, for example, no current flows between its source and drain and the input of the inverting sense amplifier SA becomes "1" through the pull-up resistor R. The output of the inverting sense amplifier SA accordingly becomes "0", but since the output of the OR circuit OR1 is "1", the exclusive OR circuit EX1 acts as an inverter to obtain an output of "1".

When the memory cell M11 in the second column is selected, a current flows between its source and drain and the input of the inverting sense amplifier SA becomes "0". The output of the inverting sense amplifier SA accordingly becomes "1", but since the output of the OR circuit OR1 is "1", the exclusive OR circuit EX1 acts as an inverter to obtain an output of "0". Furthermore, the probability of direct current flowing in the second column is 25%.

The same is applied to the third and fourth columns, and therefore the probability of the third and fourth columns is each 25%. As the result, the probability of direct current flowing of the sixteen memory cells on the whole becomes 25%, thereby ensuring an operation with much lower power consumption.

Although it is shown in the ROM 3000 of FIG. 12 that the exclusive OR circuit EX1 acts as an inverter when one of the bit lines BL1, BL2 and BL3 is selected, which is controlled by the three-input OR circuit OR1, the combination of three bit lines out of the four bit lines may be changed at will. Furthermore, there may be a configuration where a two-input OR circuit is used, instead of the three-input OR circuit OR1, to make the exclusive OR circuit EX1 act as an inverter when any two of the four bit lines are selected.

Furthermore, the second, third and fourth columns of the ROM 3000 as discussed above are programmed in the manner opposite to the background-art ROM 400. If these columns of the ROM 3000 are programmed in the same manner as the ROM 400, the probability of direct current flowing would be 75% provided that access to every memory cell is made with equal probability. For this reason, the present invention is applied to these columns in order to reduce the probability of direct current flowing. On the other hand, since the probability of direct current flowing in the first column when programmed in the same manner as the ROM 400 is 25%, there is no need for applying the present invention to the first column.

For example, the first column of the ROM 3000 is programmed in the same manner as the first column of the ROM 400, which is the case where the present invention is not applied. The present invention does not have to be applied to a case where the probability of direct current flowing does not exceed 50% because access to every memory cell is not necessarily made with equal probability, or a case where the degree of a waste of power consumption is negligible even when the probability of direct current flowing exceeds 50%.

Therefore, even if a ROM includes a plurality of columns each of which is programmed so that more than half of memory cells may be the ON/OFF controllable memory cells, it is not necessary to apply the present invention to all of the columns.

< C-4. Characteristic Effect >

As discussed above, in the ROM 3000 which uses four columns for 1-bit data output as the semiconductor memory device of the third preferred embodiment, the programming of the memory cells in the first column with the probability of direct current flowing of 25% is not reversed, and the programmings of the memory cells in the second to fourth columns each with the probability of direct current flowing of more than 50% are reversely made. Accordingly, when one of the memory cells in the second to fourth columns are selected, reverse data, i.e., the reverse equivalent of the desired data are obtained. Then, the exclusive OR circuit EX1 which is connected to the output of the inverting sense amplifier SA inverts the output from the inverting sense amplifier SA, thereby obtaining the desired data. Having the above configuration, the third preferred embodiment allows reduction of the probability of direct current flowing in the transistors of the memory cells, and thereby ensures an operation with lower power consumption.

The Fourth Preferred Embodiment:

< D-1. Configuration of ROM 4000 >

It has been discussed in the third preferred embodiment that the ROM 3000 includes the three-input OR circuit OR1 whose three inputs are connected to the outputs Y1, Y2 and Y3 of the Y-decoder 3 to generate the control signal of inversion/not-inversion by performing a logic operation and whose output is connected to the input of the exclusive OR circuit EX1. Refereeing now to FIG. 13, the ROM 4000 as the fourth preferred embodiment including a four-input OR circuit OR2, instead of the three-input OR circuit OR1, will be discussed. In the ROM 4000 of FIG. 13, the same elements as the ROM 3000 of FIG. 11 are given the same reference characters and duplicate discussion will be omitted.

Any one of the first to fourth configurations of OFF-state memory cell may be used in the ROM 4000. When the first configuration is used in the ROM 4000, a specific example of programming of the ROM 4000 is the same as that of the ROM 3000 of FIG. 12, so it is not shown.

Figure 13:
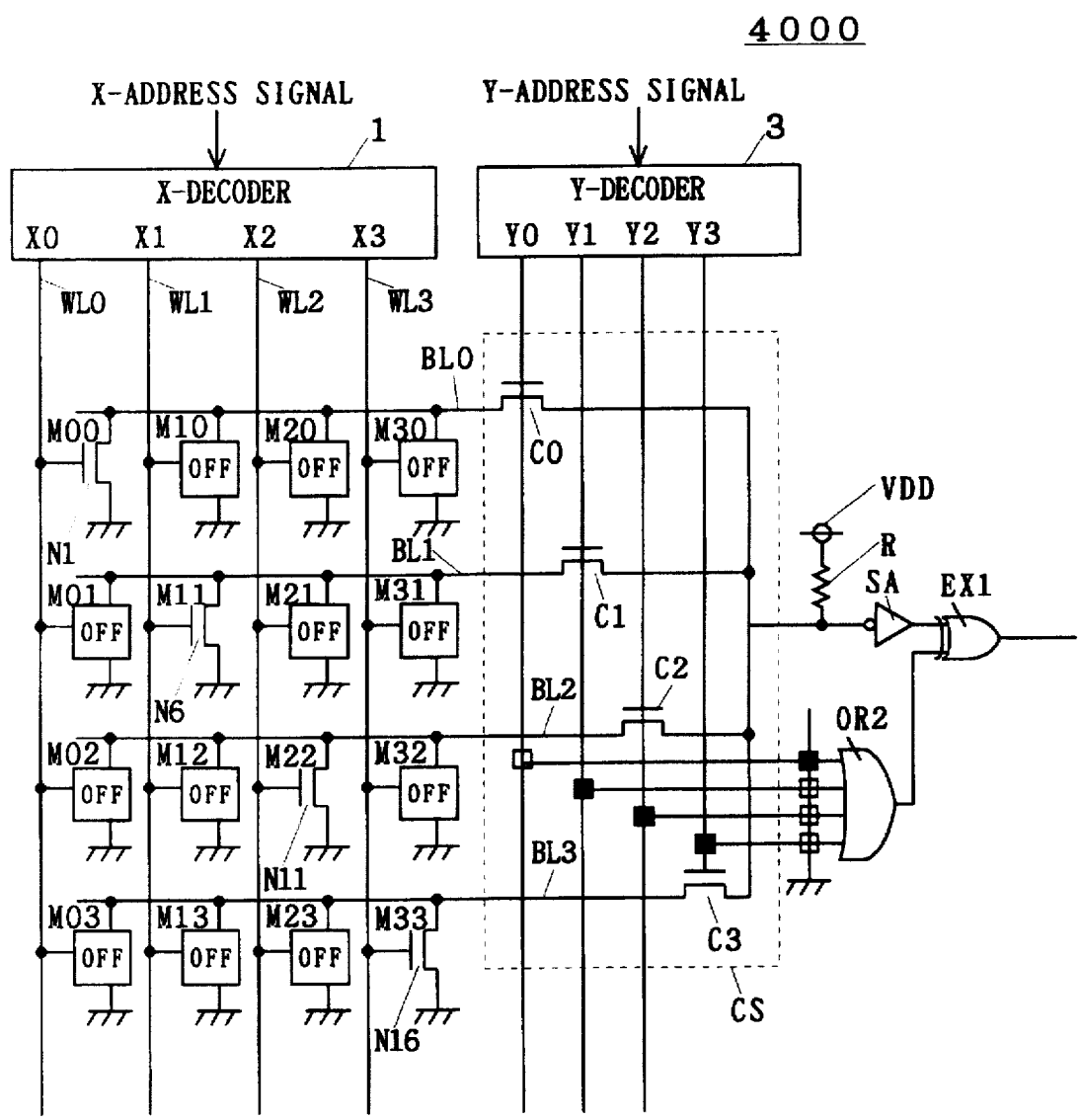
FIG. 13 is a circuit diagram showing a semiconductor memory device in accordance with a fourth preferred embodiment of the present invention.

In the ROM 4000 of FIG. 13, three inputs of the four-input OR circuit OR2 are connected to the outputs Y1, Y2 and Y3 of the Y-decoder 3 and the remaining one input is connected to the ground potential GND. Accordingly, the input connected to the ground potential GND is always "0". In this figure, solid squares represent connection between wires and blank squares represent non-connection between wires, which shall apply to the following figures.

< D-2. Operation of ROM 4000 >

Next, an operation of the ROM 4000 will be discussed. When the output Y0 of the Y-decoder 3 is activated to turn on the transistor C0 acting as a column selector CS and the bit line BL0 is selected, in other words, the first column is selected, the output of the OR circuit OR2 is "0" and accordingly the exclusive OR circuit EX1 does not act as an inverter to output the output of the inverting sense amplifier SA without inversion.

On the other hand, when one of the outputs Y1, Y2 and Y3 of the Y-decoder 3 is activated and one of the bit lines BL1, BL2 and BL3 is selected, the output of the OR circuit OR2 is "1" and accordingly the exclusive OR circuit EX1 acts as an inverter to invert the output of the inverting sense amplifier SA to be outputted.

< D-3. Characteristic Effect >

Since the programming of the ROM 4000 is the same as that of the ROM 3000 of FIG. 11 as discussed above, the same effect of reducing the probability of direct current flowing is produced to thereby ensure an operation with low power consumption. The connection of the inputs of the OR circuit OR1 to the outputs Y1, Y2 and Y3 of the Y-decoder 3 in the ROM 3000 is made in an earlier stage of the manufacturing process, e.g., in a step of interconnecting wires of the first wire layer (the first aluminum wire) to transistors. On the other hand, the connection of the inputs of the OR circuit OR2 to the outputs Y1, Y2 and Y3 of the Y-decoder 3 in the ROM 4000 is made in a later stage, e.g., in a programming step.

For example, a wire extending from the outputs Y0, Y1, Y2 and Y3 of the Y-decoder 3 and a wire connected to the ground potential GND are formed on the first wire layer (the first aluminum wires) and thereon a wire extending from the four inputs of the OR circuit OR2 is formed on the second wire layer (the second aluminum wire) with an insulating layer interposed therebetween. The connection of the four inputs of the OR circuit OR2 to the outputs Y0 to Y3 of the Y-decoder 3 is determined in accordance with the programming of the memory cells in the first to fourth columns. In this case, a through hole TH is provided in the insulating layer between the wire layers for interconnection and the through hole TH is filled with a wire material to ensure conduction.

Thus, it is possible to establish connection of the four inputs of the OR circuit OR2 through the same programming step as that of the background art. Therefore, an increase in the number of steps and manufacturing cost to accomplish the present invention is prevented.

Furthermore, it is sure that the connection of the inputs of the OR circuit OR2 can easily respond to a variety of programs for memory cells. For example, the two inputs may be connected to two columns or may be connected to four columns.

The Fifth Preferred Embodiment:

< E-1. Configuration of ROM 5000 >

It has been discussed in the fourth preferred embodiment that the ROM 4000 includes the four-input OR circuit OR2 whose four inputs are connected to the outputs Y0 to Y3 of the Y-decoder 3 to generate the control signal of inversion/not-inversion by performing a logic operation and whose output is connected to the input of the exclusive OR circuit EX1. Refereeing now to FIG. 14, the ROM 5000 including a two-input OR circuit OR3, instead of the four-input OR circuit OR2, will be discussed as the fifth preferred embodiment. In the ROM 5000 of FIG. 14, the same elements as the ROM 3000 of FIG. 11 are given the same reference characters and duplicate discussion will be omitted.

Figure 14:
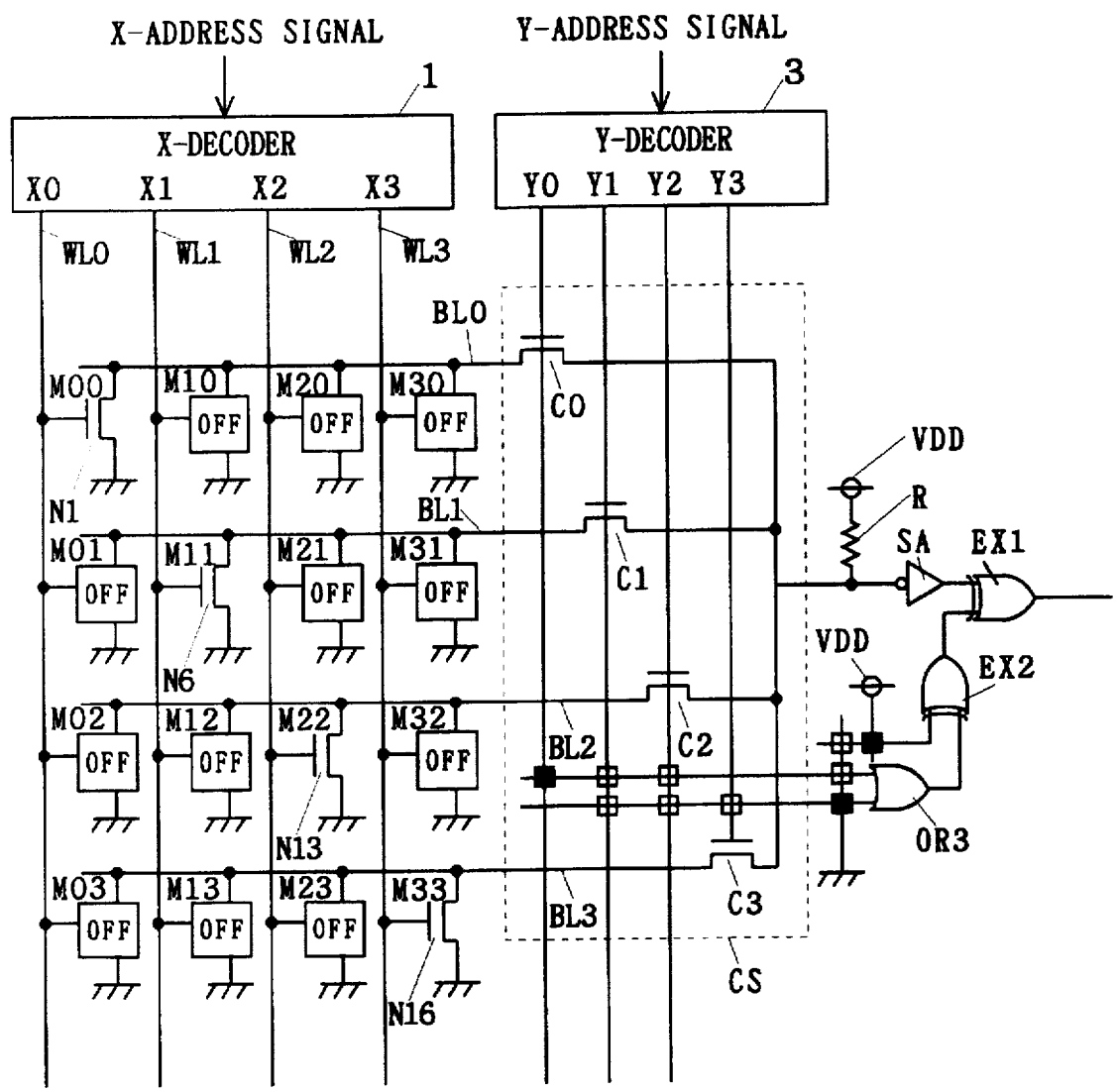
FIGS. 14 to 16 are circuit diagrams showing a semiconductor memory device in accordance with a fifth preferred embodiment of the present invention.

In the ROM 5000 of FIG. 14, one of two inputs of the OR circuit OR3 are connected to the output Y0 of the Y-decoder 3 and the other input is connected to the ground potential GND. An output of the OR circuit OR3 is connected to one of two inputs of an exclusive OR circuit EX2 and the other input is connected to the power supply potential VDD. An output of the exclusive OR circuit EX2 is connected to the input of the exclusive OR circuit EX1.

< E-2. Operation of ROM 5000 >

Next, an operation of the ROM 5000 of FIG. 14 will be discussed. When the output Y0 of the Y-decoder 3 is activated to turn on the transistor C0 acting as a column selector CS and the bit line BL0 is selected, in other words, the first column is selected, the output of the OR circuit OR3 is "1". Receiving the output of the OR circuit OR3, the output of the exclusive OR circuit EX2 becomes "0" and accordingly the exclusive OR circuit EX1 does not act as an inverter to output the output of the inverting sense amplifier SA without inversion.

On the other hand, when one of the outputs Y1, Y2 and Y3 of the Y-decoder 3 is activated and one of the bit lines BL1, BL2 and BL3 is selected, the output Y0 of the Y-decoder 3 is "0" and accordingly the output of the OR circuit OR3 is "0". Receiving the output of the OR circuit OR3, the output of the exclusive OR circuit EX2 becomes "1" and accordingly the exclusive OR circuit EX1 acts as an inverter to invert the output of the inverting sense amplifier SA to be outputted.

Figure 15:
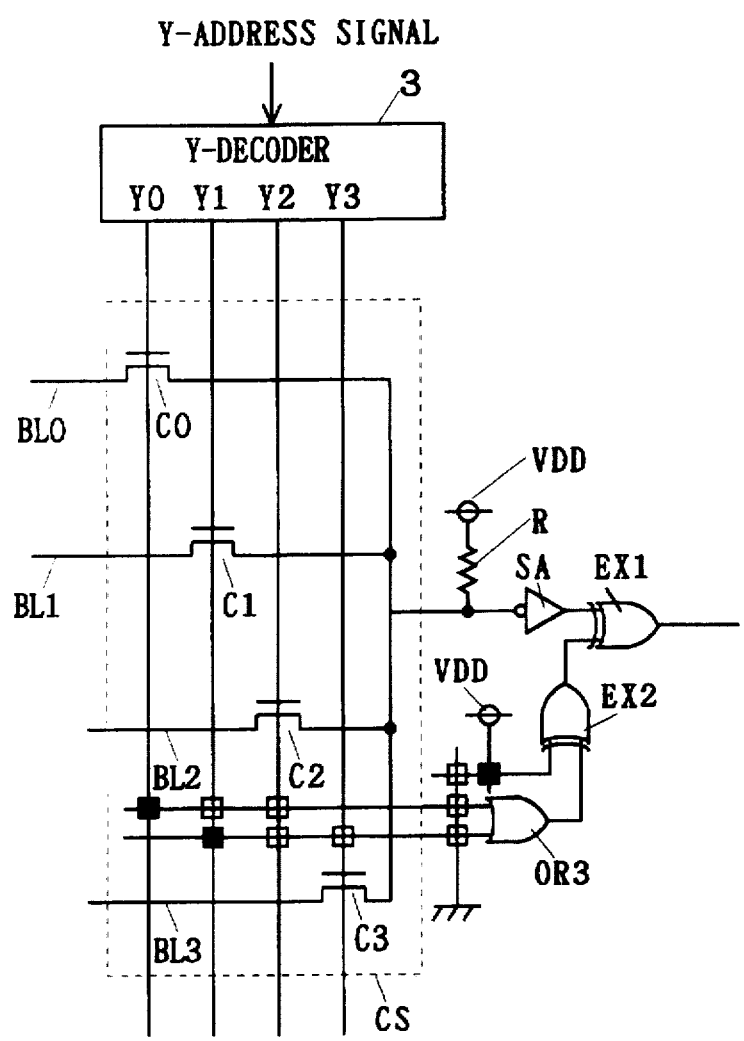

While FIG. 14 shows a configuration where the exclusive OR circuit EX1 acts as an inverter when any column other than the first column is selected, FIG. 15 shows a configuration where the exclusive OR circuit EX1 acts as an inverter when any column other than the first and second columns is selected.

In the ROM 5000 of FIG. 15, the two inputs of the OR circuit OR3 are connected to the outputs Y0 and Y1 of the Y-decoder 3. Other configurational features are the same as those of FIG. 14 and duplicate discussion will be omitted. The programming of the memory cells of FIG. 15 is different from that of FIG. 14, but is not shown.

Next, an operation of the ROM 5000 of FIG. 15 will be discussed. When the output Y0 of the Y-decoder 3 is activated to turn on the transistor C0 acting as a column selector CS and the bit line BL0 is selected, in other words, the first column is selected, the output of the OR circuit OR3 is "1". Receiving the output of the OR circuit OR3, the output of the exclusive OR circuit EX2 becomes "0" and accordingly the exclusive OR circuit EX1 does not act as an inverter to output the output of the inverting sense amplifier SA without inversion.

Similarly, when the output Y1 of the Y-decoder 3 is activated to turn on the transistor C1 acting as a column selector CS and the bit line BL1 is selected, in other words, the second column is selected, the output of the OR circuit OR3 is "1". Receiving the output of the OR circuit OR3, the output of the exclusive OR circuit EX2 becomes "0" and accordingly the exclusive OR circuit EX1 does not act as an inverter to output the output of the inverting sense amplifier SA without inversion.

On the other hand, when either the output Y2 or Y3 of the Y-decoder 3 is activated and either the bit line BL2 or BL3 is selected, the outputs Y0 and Y1 of the Y-decoder 3 each indicate "0" and accordingly the output of the OR circuit OR3 is "0". Receiving the output of the OR circuit OR3, the output of the exclusive OR circuit EX2 becomes "1" and accordingly the exclusive OR circuit EX1 acts as an inverter to invert the output of the inverting sense amplifier SA to be outputted.

Figure 16:
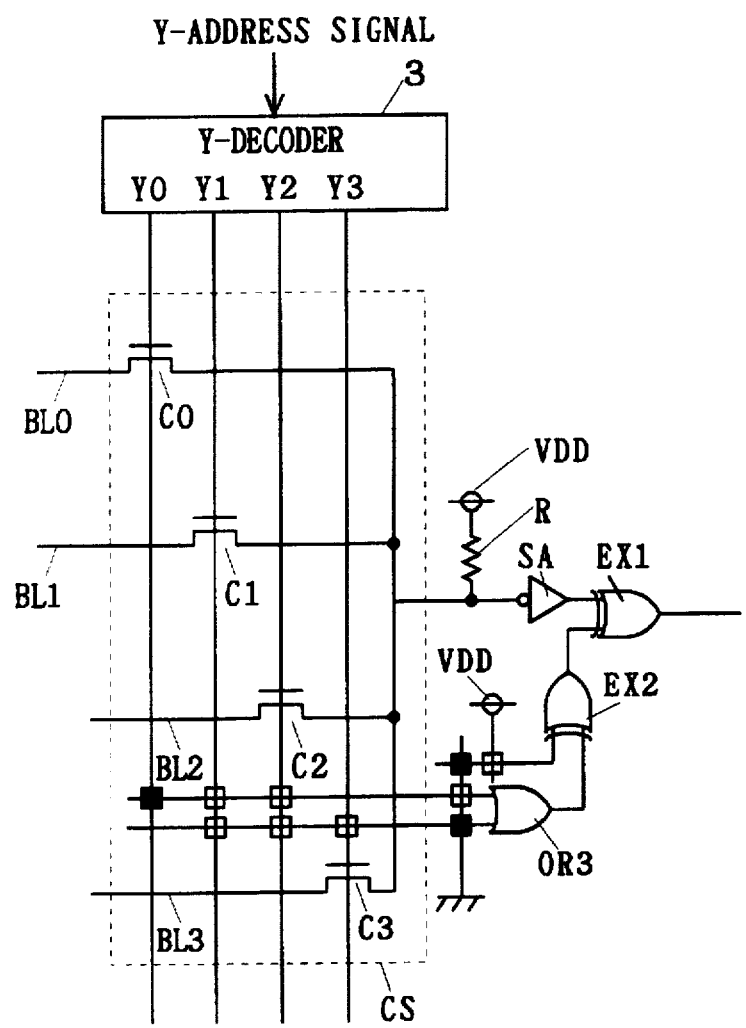

While FIG. 15 shows a configuration where the exclusive OR circuit EX1 acts as an inverter when any column other than the first and second columns is selected, FIG. 16 shows a configuration where the exclusive OR circuit EX1 acts as an inverter only when the first column is selected.

In the ROM 5000 of FIG. 16, one of the two inputs of the OR circuit OR3 is connected to the output Y0 of the Y-decoder 3 and the other input is connected to the ground potential GND. Other configurational features are the same as those of FIG. 14 and duplicate discussion will be omitted. The programming of the memory cells of FIG. 16 is different from that of FIG. 14, but is not shown.

Next, an operation of the ROM 5000 of FIG. 16 will be discussed. When the output Y0 of the Y-decoder 3 is activated to turn on the transistor C0 acting as a column selector CS and the bit line BL0 is selected, in other words, the first column is selected, the output of the OR circuit OR3 is "1". Receiving the output of the OR circuit OR3, the output of the exclusive OR circuit EX2 becomes "1" and accordingly the exclusive OR circuit EX1 acts as an inverter to invert the output of the inverting sense amplifier SA to be outputted.

On the other hand, when one of the outputs Y1 to Y3 of the Y-decoder 3 is activated and one of the bit lines BL1 to BL3 is selected, the output Y0 of the Y-decoder 3 indicates "0" and accordingly the output of the OR circuit OR3 is "0". Receiving the output of the OR circuit OR3, the output of the exclusive OR circuit EX2 becomes "0" and accordingly the exclusive OR circuit EX1 does not act as an inverter to output the output of the inverting sense amplifier SA without inversion.

< E-3. Characteristic Effect >

The ROM 5000 achieves the same effect of reducing the probability of direct current flowing to ensure an operation with low power consumption as the ROM 4000. Moreover, since the control signal of inversion/not-inversion is generated by performing a logic operation with the two-input OR circuit OR3 and the exclusive OR circuit EX2 in the ROM 5000 even when the selection of the four columns is made using the four outputs Y0 to Y3 of the Y-decoder 3, the OR circuit OR3 and the Y-decoder 3 can be connected with two wires, the number of which is half of the number of the columns.

This configuration is advantageous in a case of an increase in the number of columns. For example, eight columns may be connected with four wires by using a four-input OR circuit.

With high integration of a memory, in general, the pitch of the memory cells decreases and the pitch of the columns also decreases, and accordingly, the placement of wires for connecting the OR circuit to the Y-decoder takes more difficulty. In such a case, this preferred embodiment, which allows reduction in the number of wires for connecting the OR circuit to the Y-decoder, has a great advantage.

Furthermore, although the memory cell including the NMOS transistor has been discussed in the first to fifth preferred embodiment, it is sure that the memory cell may include a PMOS transistor.

The Sixth Preferred Embodiment:

< F-1. Configuration of ROM 6000 >

Figure 17:
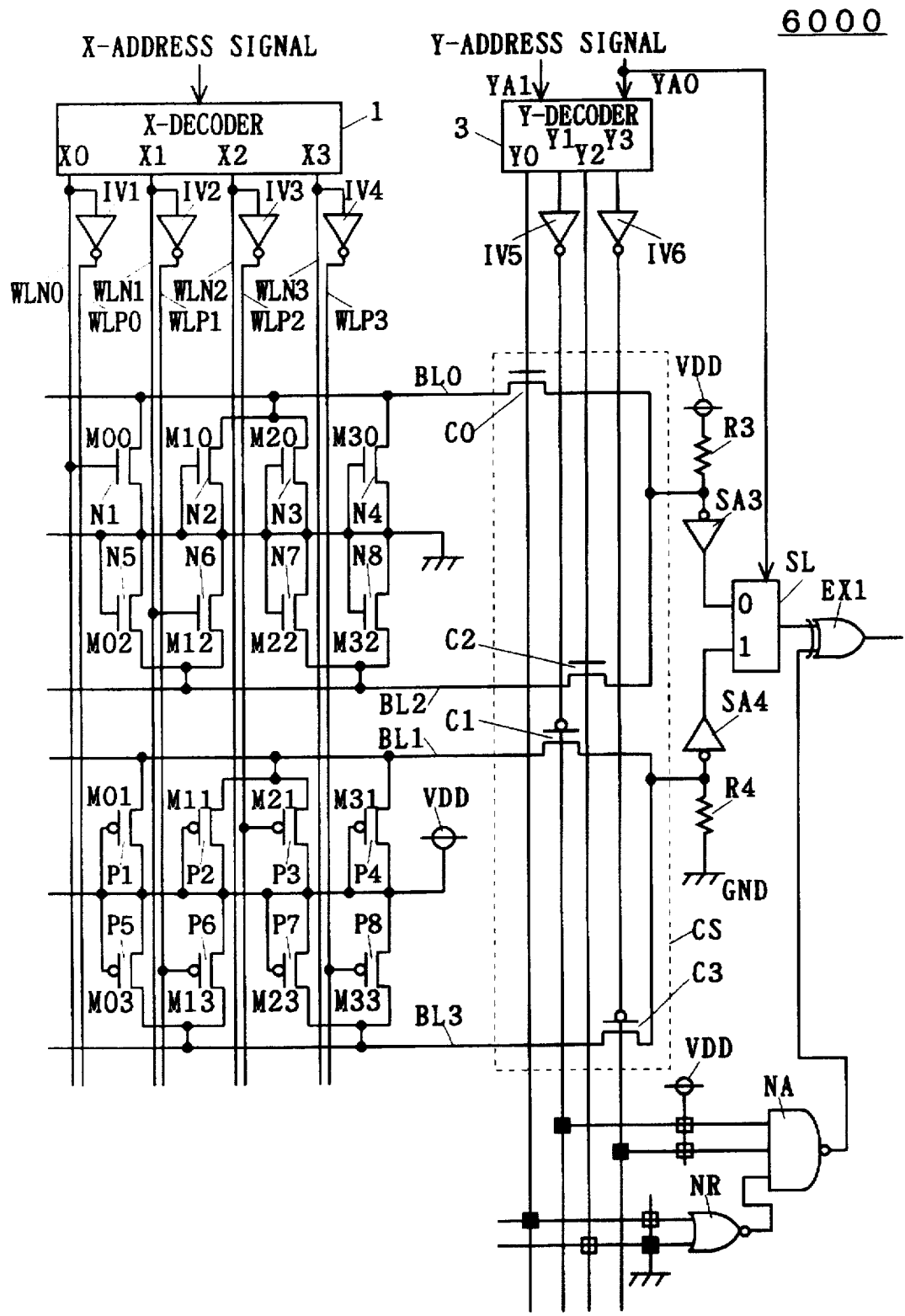
FIG. 17 is a circuit diagram showing a semiconductor memory device in accordance with a sixth preferred embodiment of the present invention.

FIG. 17 is a circuit diagram of a ROM 6000, which is a semiconductor memory device in accordance with the sixth preferred embodiment of the present invention. The ROM 6000 of FIG. 17 is an example of a ROM including gate isolation type CMOS gate array, and the memory cells of the ROM 6000 are divided into NMOS memory cells (memory cells each including an NMOS transistor) and PMOS memory cells (memory cells each including a PMOS transistor).

An address signal is applied to the NMOS memory cells through the word lines WLN0 to WLN3 connected to the outputs X0 to X3 of the X-decoder 1, respectively. On the other hand, the address signal is applied to the PMOS memory cells through the word lines WLP0 to WLP3 which are connected to the outputs X0 to X3 of the X-decoder 1 through inverter circuits IV1 to IV4, respectively, since it is necessary to reverse the address signal (word line logic).

A memory cell line consisting of the word lines WLN0 to WLN3, the bit line BL0 and NMOS transistors are referred to as "the first column", and a memory cell line consisting of the word lines WLN0 to WLN3, the bit line BL2 and NMOS transistors are referred to as "the second column". A memory cell line consisting of the word lines WLP0 to WLP3, the bit line BL1 and PMOS transistors are referred to as "the third column", and a memory cell row consisting of the word lines WLP0 to WLP3, the bit line BL3 and PMOS transistors are referred to as "the fourth column".

The bit lines BL0 and BL2 are connected to the source electrodes of NMOS transistors C0 and C2, respectively, and the drain electrodes of transistors C0 and C2 are connected in common to an input of an inverting sense amplifier SA3.

The bit lines BL1 and BL3 are connected to the drain electrodes of PMOS transistors C1 and C3, respectively, and the source electrodes of transistors C1 and C3 are connected in common to an input of an inverting sense amplifier SA4.

The NMOS transistors C0 and C2 and the PMOS transistors C1 and C3 act as a column selector CS. The input of the inverting sense amplifier SA3 is connected to the power supply potential VDD through a pull-up resistor R3 and the input of the inverting sense amplifier SA4 is connected to the ground potential GND through a pull-up resistor R4.

The gate electrodes of NMOS transistors C0 and C2 are connected to the outputs Y0 and Y2 of the Y-decoder 3, respectively, which specifies a Y-address, and the gate electrodes of PMOS transistors C1 and C3 are connected to the outputs Y1 and Y3 of the Y-decoder 3 through inverter circuits IV5 and IV6, respectively.

The memory cells in the first column are represented by the reference characters M00, M10, M20 and M30 from the left-hand side. The memory cells in the second column are represented by the reference characters M02, M12, M22 and M32 from the left-hand side. The memory cells in the third column are represented by the reference characters M01, M11, M21 and M31 from the left-hand side. The memory cells in the fourth column are represented by the reference characters M03, M13, M23 and M33 from the left-hand side.

In FIG. 17, an output of the inverting sense amplifier SA3 and an output of the inverting sense amplifier SA4 are connected to a selector SL, and an output of the selector SL is connected to one of the two inputs of the exclusive OR circuit EX1.

The selector SL acts as a switching element to pass only one of the outputs of the inverting sense amplifiers SA3 and SA4, and a switching operation of the selector SL is controlled by an address signal YA0 applied to the Y-decoder 3.

In this case, the NMOS memory cells are connected to the inverting sense amplifier SA3 and the PMOS memory cells are connected to the inverting sense amplifier SA4 since NMOS and PMOS require different properties of the sense amplifiers.

An operation of the Y-decoder 3 and the switching operation of the selector SL will be now discussed. The Y-decoder 3 is a device for receiving two address signals the YA0 and YA1 and outputting a signal to the outputs Y0 to Y3 of the Y-decoder 3. FIG. 18 is a truth table showing a relation between the address signals YA0 and YA1 and the outputs Y0 to Y3 of the Y-decoder 3.

As can be seen from FIG. 18, when both the address signals YA0 and YA1 indicate "0", the output Y0 indicates "1" and others indicate "0". When the address signal YA0 indicates "1" and the address signal YA1 indicates "0", the output Y1 indicates "1" and others indicate "0". When the address signal YA0 indicates "0" and the address signal YA1 indicates "1", the output Y2 indicates "1" and others indicate "0". When both the address signals YA0 and YA1 indicate "1", the output Y3 indicates "1" and others indicate "0".

Accordingly, when the first column is selected, that is, when the output Y0 indicates "1", the address signal YA0 indicates "0". Since the output of the inverting sense amplifier SA3 is required to pass through the selector SL when the first column is selected, the selector SL makes a switch of its signal path so that the output of the inverting sense amplifier SA3 can pass therethrough. The same operation is performed when the second column is selected.

On the other hand, when the third column is selected, that is, the output Y1 indicates "1", the address signal YA0 indicates "1". Since the output of the inverting sense amplifier SA4 is required to pass through the selector SL when the third column is selected, the selector SL makes a switch of its signal path so that the output of the inverting sense amplifier SA4 can pass therethrough. The same operation is performed when the fourth column is selected.

The other input of the exclusive OR circuit EX1 is connected to an output of a three-input NAND circuit NA and the three inputs thereof is connected to the respective gate signal lines of the PMOS transistors C1 and C3 and an output of a two-input NOR circuit NR.

One of the two inputs of the NOR circuit NR is connected to the gate signal line of the NMOS transistor C0 and the other input is connected to the ground potential GND.

< F-2. Programming >

Next, programming of the ROM 6000 will be discussed. In the first column of the ROM 6000 of FIG. 17, the gate electrode of NMOS transistor N1 of the memory cell M00 is connected to the word line WLN0 (to be ON/OFF controllable), and the gate electrodes of NMOS transistors of other memory cells are connected to the ground potential GND (fixed in the OFF state).

Similarly in the second column, the gate electrode of NMOS transistor N6 of the memory cell M12 is connected to the word line WLN1 (to be ON/OFF controllable), and the gate electrodes of NMOS transistors of other memory cells are connected to the ground potential GND (fixed in the OFF state).

In the third column, the gate electrode of PMOS transistor P3 of the memory cell M21 is connected to the word line WLP2 (to be ON/OFF controllable), and the gate electrodes of PMOS transistors of other memory cells are connected to the power supply potential VDD (fixed in the OFF state).

Similarly in the fourth column, the gate electrode of PMOS transistor P8 of the memory cell M33 is connected to the word line WLP3 (to be ON/OFF controllable), and the gate electrodes of PMOS transistors of other memory cells are connected to the power supply potential VDD (fixed in the OFF state).

The source electrodes of NMOS transistors N1 to N8 are connected in common to the ground potential GND. The drain electrodes of NMOS transistors N2 and N3 are connected in common to the bit line BL0, and the drain electrodes of NMOS transistors N5 and N6 and those of NMOS transistors N7 and N8 are connected in common to the bit line BL2.

The source electrodes of PMOS transistors P1 to P8 are connected in common to the power supply potential VDD. The drain electrodes of PMOS transistors P2 and P3 are connected in common to the bit line BL1, and the drain electrodes of PMOS transistors P5 and P6 and those of NMOS transistors P7 and P8 are connected in common to the bit line BL3.

This connection takes full advantage of the ROM including basic cell units of gate isolation type CMOS gate array.

Figure 19A:
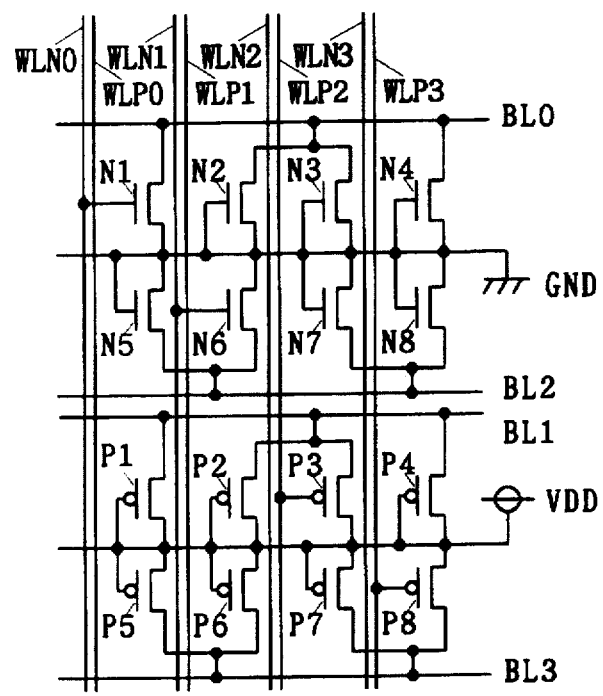
FIGS. 19A and 19B are diagrams illustrating a layout of the semiconductor memory device in accordance with the sixth preferred embodiment of the present invention.
Figure 19B:
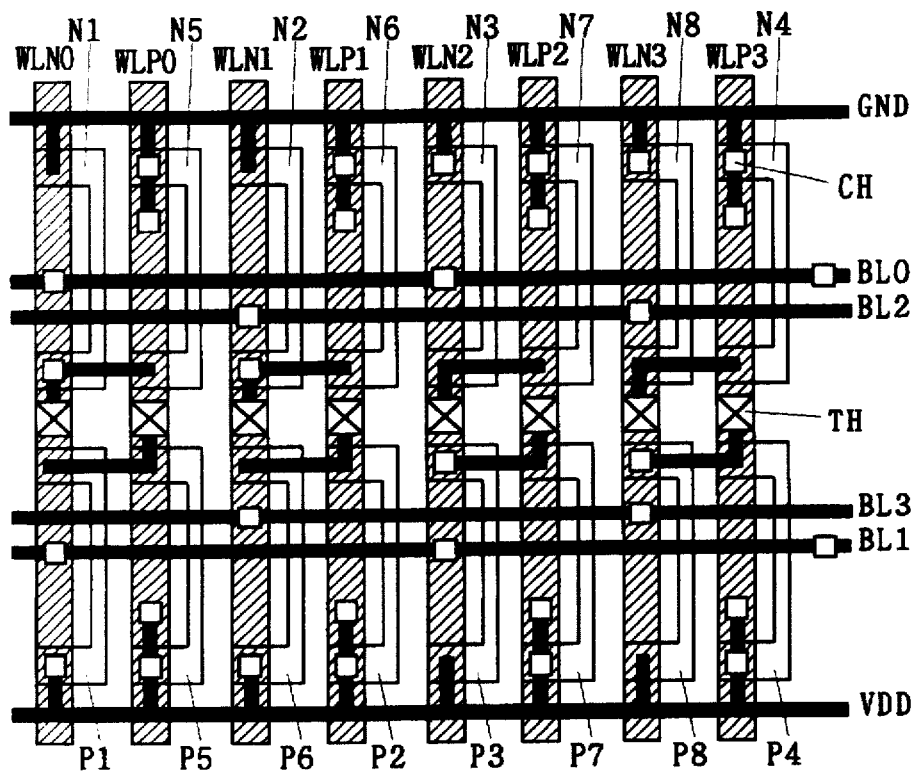

FIG. 19A is a circuit diagram of the memory cells of the ROM 6000 and FIG. 19B is a circuitry layout view of the memory cells of FIG. 19A, which include basic cell units of gate isolation type CMOS gate array. In FIG. 19B, the gate electrodes of NMOS transistors N1 to N8 are arranged in an upper stage and the gate electrodes of PMOS transistors P1 to P8 are arranged in an lower stage.

The source-drain region is formed in the outside of a layer under the gate electrode along the direction of its length. A layer including the source-drain region is formed under the gate electrode. On the source-drain regions, the source and drain electrodes are formed but not shown for simplification.

If the drain region is formed on left-hand side of a layer under the gate electrode of NMOS transistor N1 in this figure, the source region is formed on right-hand side of the layer, where the source region of NMOS transistor N5 is also included. Accordingly, when the source electrode of NMOS transistor N1 and the source electrode of NMOS transistor N5 are connected in common to the ground potential GND and the gate electrode of NMOS transistor N5 is connected to the ground potential GND as shown in FIG. 19A, the common source region of the NMOS transistors N1 and N5 is provided with a contact hole CH and the gate electrode of NMOS transistor N5 is also provided with a contact hole CH, and then a GND wire which is a wire of the first wire layer (the first aluminum wire) is formed on both the contact holes.

In FIG. 19B, the drain region of NMOS transistor N1 is connected to the bit line BL0 through the contact hole CH, the gate electrode of NMOS transistor N1 is connected to the wire of the first wire layer (the first aluminum wire) and the wire of the first wire layer is connected to the word line WLN0 which is a wire of the second wire layer through the through hole TH. Furthermore, other connections are also made using the contact holes CH and the through holes TH, but will not be discussed.

The contact hole CH is an opening formed on an insulating layer to connect the electrode and the semiconductor region to the wire. The through hole TH is an opening formed on the insulating layer to establish connection between the wires, for example, the wire of the first wire layer (the first aluminum wire) and the wire of the second wire layer (the second aluminum wire). In FIG. 19B, the blank squares represent the contact holes CH and squares containing a cross (X) represent the through holes TH.

The above connection integrating common wires takes full advantage of the ROM including basic cell units of gate isolation type CMOS gate array.

Moreover, since the connection of the electrode and the semiconductor region to the wires is established through the contact holes CH, the connection can be changed only by changing arrangement of the contact holes CH, without changing the layout of wires. That's also a characteristic feature of the ROM including the basic cell units of the gate isolation type CMOS gate array.

< F-3. Operation of ROM 6000 >

Next, an operation of the ROM 6000 of FIG. 17 will be discussed. When the output Y0 of the Y-decoder 3 is activated to turn on the NMOS transistor C0 acting as a column selector CS and the bit line BL0 is selected, in other words, the first column is selected, the output of the inverting sense amplifier SA3 passes through the selector SL, as discussed earlier, and is applied to one of the two inputs of the exclusive OR circuit EX1. The same operation is performed when the output Y2 of the Y-decoder 3 is activated and the second column is selected.

When the first column is selected, the output Y0 of the Y-decoder 3 indicates "1" and accordingly the output of the NOR circuit NR becomes "0". On the other hand, the gate signals from the PMOS transistors C1 and C3 each indicate "1" and accordingly the output of the NAND circuit NA becomes "1". Receiving the output of the NAND circuit NA, the exclusive OR circuit EX1 acts as an inverter to invert the output of the inverting sense amplifier SA3 to be outputted.

When the second column is selected, the output Y0 of the Y-decoder 3 indicates "0" and accordingly the output of the NOR circuit NR becomes "1". The gate signals from the PMOS transistors C1 and C3 each indicate "1" and accordingly the output of the NAND circuit NA becomes "0". Receiving the output of the NAND circuit NA, the exclusive OR circuit EX1 does not act as an inverter to output the output of the inverting sense amplifier SA3 without inversion.

When the output Y1 of the Y-decoder 3 is activated to turn on the PMOS transistor C1 acting as a column selector CS and the bit line BL1 is selected, in other words, the third column is selected, the output of the inverting sense amplifier SA4 passes through the selector SL, as discussed earlier, and is applied to one of the two inputs of the exclusive OR circuit EX1. The same operation is performed when the output Y3 of the Y-decoder 3 is activated and the fourth column is selected.

When the third column is selected, the output Y0 of the Y-decoder 3 indicates "0" and accordingly the output of the NOR circuit NR becomes "1". The gate signal from the PMOS transistor C1 indicates "0" and the gate signal from the PMOS transistor C3 indicates "1", and accordingly the output of the NAND circuit NA becomes "1". Receiving the output of the NAND circuit NA, the exclusive OR circuit EX1 acts as an inverter to invert the output of the inverting sense amplifier SA4 to be outputted.

When the fourth column is selected, the output Y0 of the Y-decoder 3 indicates "0" and accordingly the output of the NOR circuit NR becomes "1". The gate signal from the PMOS transistor C1 indicates "1" and the gate signal from the PMOS transistor C3 indicates "0", and accordingly the output of the NAND circuit NA becomes "1". Receiving the output of the NAND circuit NA, the exclusive OR circuit EX1 acts as an inverter to invert the output of the inverting sense amplifier SA4 to be outputted.

Figure 20:
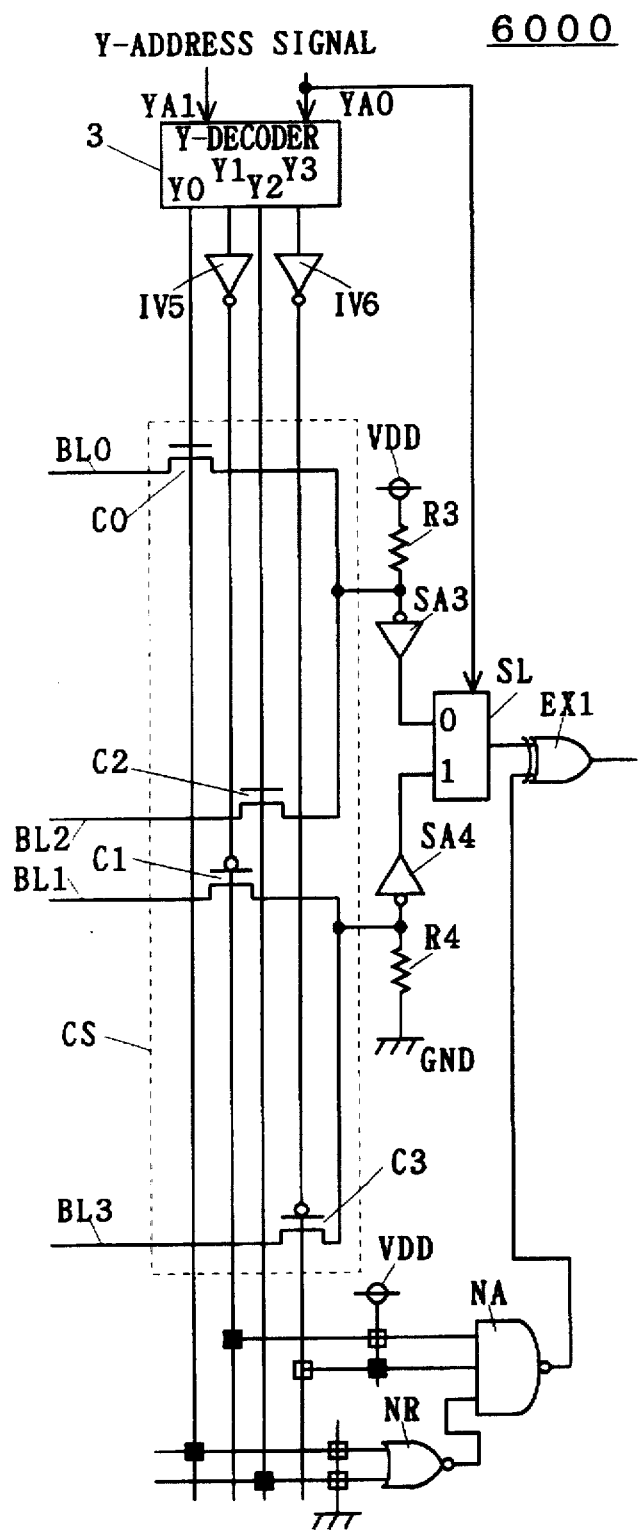
FIGS. 20 to 21 are circuit diagrams showing the semiconductor memory devices in accordance with the sixth preferred embodiment of the present invention.

While FIG. 17 shows a configuration where the exclusive OR circuit EX1 does not act as an inverter when the second column is selected, FIG. 20 now shows a configuration where the exclusive OR circuit EX1 does not act as an inverter when the fourth column is selected.

In the ROM 6000 of FIG. 20, the three inputs of the NAND circuit NA are connected to the gate signal line of the PMOS transistor C1, the power supply potential VDD and the output of the NOR circuit NR.

The two inputs of the NOR circuit NR are connected to the gate signal lines of the NMOS transistors C0 and C2. Other configurational features are the same as those of FIG. 17 and duplicate discussion will be omitted. Furthermore, the programming of the memory cells is different from that of FIG. 17, but not shown.

Next, an operation of the ROM 6000 of FIG. 20 will be discussed. When the output Y3 of the Y-decoder 3 is activated to turn on the PMOS transistor C3 acting as a column selector CS and the bit line BL3 is selected, in other words, the fourth column is selected, the output of the NOR circuit NR becomes "1". Accordingly, all of the inputs of the NAND circuit NA each indicate "1" and the output of the NAND circuit NA becomes "0". Receiving the output of the NAND circuit NA, the exclusive OR circuit EX1 does not act as an inverter to output the output of the inverting sense amplifier SA4 without inversion.

On the other hand, when one of the outputs Y0 to Y2 of the Y-decoder 3 is activated and one of the bit lines BL0 to BL2 is selected, the output of the NAND circuit NA becomes "1". Receiving the output of the NAND circuit NA, the exclusive OR circuit EX1 acts as an inverter to invert the output of the inverting sense amplifier SA3 or SA4 to be outputted.

Figure 21:
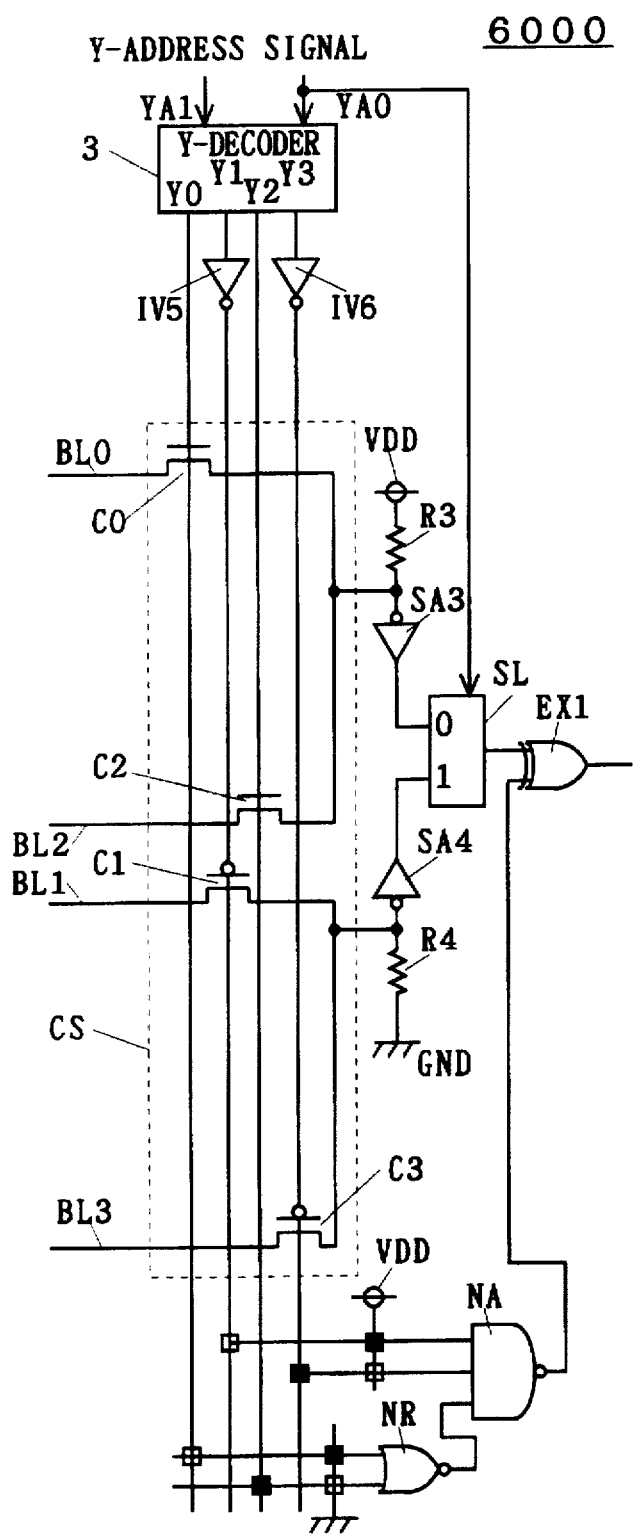

While FIG. 20 shows a configuration where the exclusive OR circuit EX1 does not act as an inverter when the fourth column is selected, FIG. 21 now shows a configuration where the exclusive OR circuit EX1 does not act as an inverter when the first and third columns are selected.

In the ROM 6000 of FIG. 21, the three inputs of the NAND circuit NA are connected to the power supply potential VDD and the gate signal line of the PMOS transistor C3, and the output of the NOR circuit NR.

One of the two inputs of the NOR circuit NR is connected to the ground potential GND and the other input is connected to the gate signal line of the NMOS transistors C2. Other configurational features are the same as those of FIG. 17 and duplicate discussion will be omitted. Furthermore, the programming of the memory cells is different from that of FIG. 17, but not shown.

Next, an operation of the ROM 6000 of FIG. 21 will be discussed. When the output Y0 of the Y-decoder 3 is activated to turn on the NMOS transistor C0 acting as a column selector CS and the bit line BL0 is selected, in other words, the first column is selected, the output of the NOR circuit NR becomes "1". Accordingly, all of the inputs of the NAND circuit NA each indicate "1" and the output of the NAND circuit NA becomes "0". Receiving the output of the NAND circuit NA, the exclusive OR circuit EX1 does not act as an inverter to output the output of the inverting sense amplifier SA3 without inversion.

When the output Y1 of the Y-decoder 3 is activated to turn on the PMOS transistor C1 acting as a column selector CS and the bit line BL1 is selected, in other words, the third column is selected, the output of the NOR circuit NR becomes "1". Accordingly, all of the inputs of the NAND circuit NA each indicate "1" and the output of the NAND circuit NA becomes "0". Receiving the output of the NAND circuit NA, the exclusive OR circuit EX1 does not act as an inverter to output the output of the inverting sense amplifier SA4 without inversion.

On the other hand, when either the output Y2 or Y3 of the Y-decoder 3 is activated and either the bit lines BL2 or BL3 is selected, the output of NAND circuit NA becomes "1". Receiving the output of the NAND circuit NA, the exclusive OR circuit EX1 acts as an inverter to invert the output of the inverting sense amplifier SA3 or SA4 to be outputted.

< F-4. Characteristic Effect >

The ROM including gate isolation type CMOS gate array achieves reduction in the probability of direct current flowing to ensure an operation with low power consumption, as well as high integration.

The Seventh Preferred Embodiment:

< G-1. Configuration of ROM 7000 >

In the NMOS memory cells of the ROM 6000 of the sixth preferred embodiment shown in FIGS. 17 to 21, the drain electrodes of NMOS transistors N2 and N3 are connected in common to the bit line BL0, and the drain electrodes of NMOS transistors N5 and N6 and those of NMOS transistors N7 and N8 are connected in common to the bit line BL2. In the PMOS memory cells, the drain electrodes of PMOS transistors P2 and P3 are connected in common to the bit line BL1, and the drain electrodes of PMOS transistors P5 and P6 and those of NMOS transistors P7 and P8 are connected in common to the bit line BL3. Thus, the source and drain electrodes of all of the transistors are connected to the bit lines.

Figure 22A:
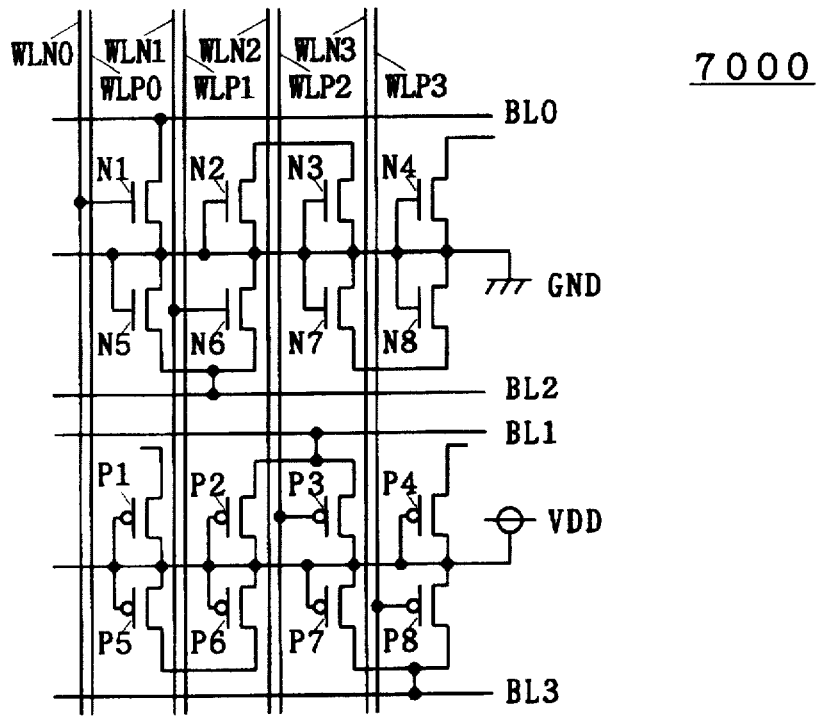
FIGS. 22A and 22B are diagrams illustrating a layout of a semiconductor memory device in accordance with a seventh preferred embodiment of the present invention.

FIG. 22A is a circuit diagram of memory cells of a ROM 7000, which is a semiconductor memory device in accordance with the seventh preferred embodiment of the present invention. Other configurational features are the same as those of the ROM 6000, and will be omitted.

In the ROM of FIG. 22A, the drain electrodes of NMOS transistors N2, N3 and N4 are not connected to the bit line BL0, and the drain electrodes of NMOS transistors N7 and N8 are not connected to the bit line BL2. The drain electrodes of PMOS transistors P1 and P4 are not connected to the bit line BL1, and the drain electrodes of PMOS transistors P5 and P6 are not connected to the BL3. Thus, more than half of the memory cells have transistors whose drain electrodes are not connected to the bit lines.

The transistors whose drain electrodes are not connected to the bit lines commonly have the gate electrodes which are connected to the ground potential GND or the power supply potential VDD, being fixed in the OFF state, each of which constitutes a memory cell carrying no direct current between the source and drain when selected.

Figure 22B:
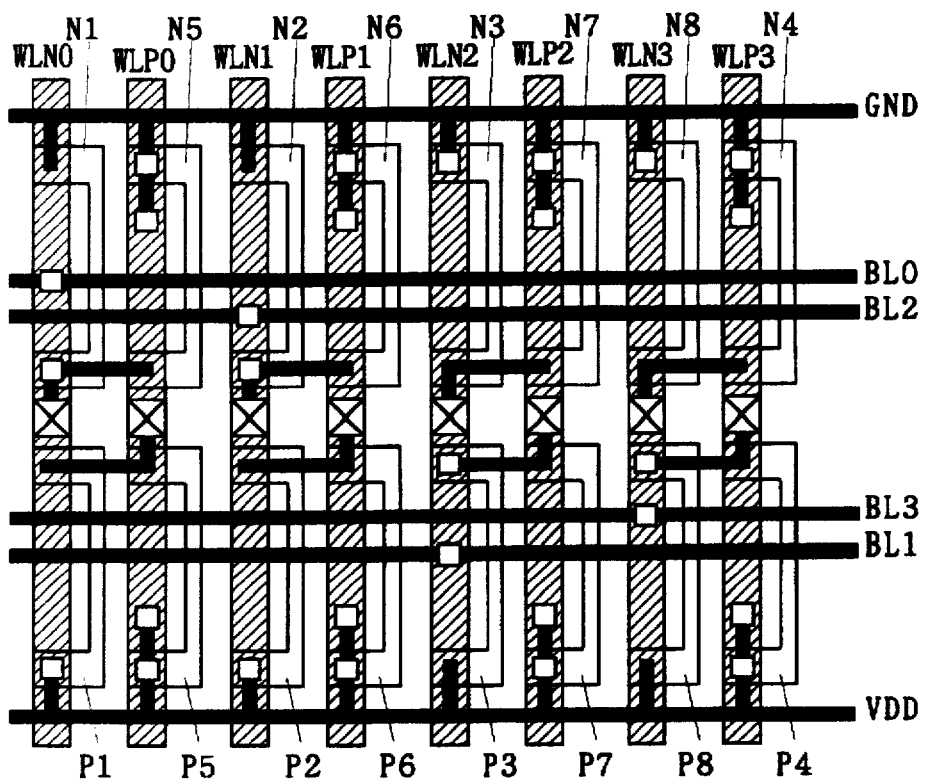

FIG. 22B is a circuitry layout view of the memory cells of FIG. 22A, which include basic cell units of gate isolation type CMOS gate array.

When the drain electrode of transistor is not connected to a bit line, no contact hole CH is provided between the source-drain region and the bit line, as shown in FIG. 22B. For example, no contact hole CH is provided to establish electrical connection between the common drain region of N-channel transistors N2 and N3 and the bit line BL0 which is the wire of the first wire layer (the first aluminum wire) formed above the common drain region. Other like portions also have no contact hole.

< G-2. Characteristic Effect >

This configuration ensures isolation of capacitance in the source and drain of the transistor which constitutes a memory cell carrying no direct current between the source and drain when selected, thereby reducing charging/discharging current to achieve an operation with low power consumption and reducing capacitance of the bit line to achieve a high-speed access to the memory cell.

The Eighth Preferred Embodiment:

< H-1. Configuration of ROM 8000 >

Figure 23:
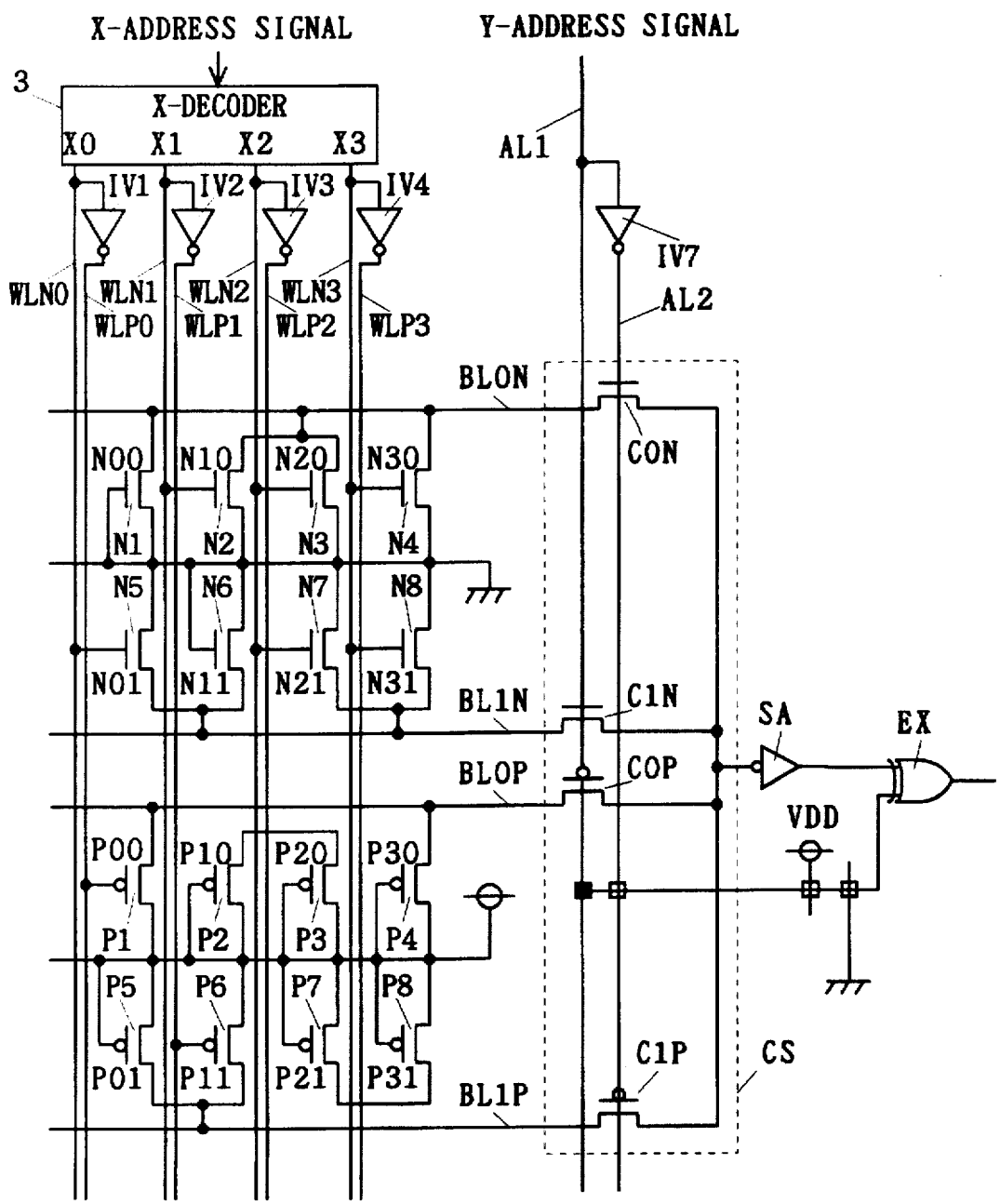
FIG. 23 is a circuit diagram showing a semiconductor memory device in accordance with an eighth preferred embodiment of the present invention.

FIG. 23 is a circuit diagram of a ROM 8000, which is a semiconductor memory device in accordance with the eighth preferred embodiment of the present invention. The ROM 8000 of FIG. 23 is an example of a ROM including gate isolation type CMOS gate array, and the memory cells of the ROM 8000 are divided into NMOS memory cells (memory cells each including an NMOS transistor) and PMOS memory cells (memory cells each including a PMOS transistor).

An address signal is applied to the NMOS memory cells through the word lines WLN0 to WLN3 connected to the outputs X0 to X3 of the X-decoder 1, respectively. On the other hand, the address signal is applied to the PMOS memory cells through the word lines WLP0 to WLP3 which are connected to the outputs X0 to X3 of the X-decoder 1 through inverter circuits IV1 to IV4, respectively, since it is necessary to reverse the address signal (word line logic).

Furthermore, the address signal is applied to the NMOS memory cells through the bit lines BL0N and BL1N and applied to the PMOS memory cells through the bit lines BL0P and BL1P.

The bit lines BL0N and BL1N are connected to the respective source electrodes of NMOS transistors C0N and C1N, and the drain electrodes of NMOS transistors C0N and C1N are connected in common to the input of the inverting sense amplifier SA.

The bit lines BL0P and BL1P are connected to the respective drain electrodes of PMOS transistors C0P and C1P, and the source electrodes of PMOS transistors C0P and C1P are connected in common to the input of the inverting sense amplifier SA.

The gate electrodes of NMOS transistor C1N and PMOS transistor C0P are connected to an address signal line AL1 receiving the address signal YA0, and the gate electrodes of NMOS transistor C0N and PMOS transistor C1P are connected to an address signal line AL2 extending from the address signal line AL1 through an inverter circuit V7. The NMOS transistors C0N and C1N and the PMOS transistors C0P and C1P serve as the column selector CS.

An output of the inverting sense amplifier SA is connected to one of the two inputs of the exclusive OR circuit EX1 and the other input is connected to the address signal line AL1.

The NMOS transistors in a memory cell line (column) consisting of the word lines WLN0 to WLN3, the bit lines BL0N and NMOS transistors and the PMOS transistors in a memory cell line (column) consisting of the word lines WLP0 to WLP3, the bit lines BL0P and PMOS transistors operate in pairs, and therefore the two memory cell rows are referred together to as "the first column pair". The NMOS transistors in a memory cell line (column) consisting of the word lines WLN0 to WLN3, the bit lines BL1N and NMOS transistors and the PMOS transistors in a memory cell line (column) consisting of the word lines WLP0 to WLP3, the bit lines BL1P and PMOS transistors operate in pairs, and therefore the two memory cell rows are referred together to as "the second column pair".

In the first column pair, the NMOS memory cells are represented by the reference characters N00, N10, N20, and N30 from the left-hand side, and the PMOS memory cells are represented by the reference characters P00, P10, P20, and P30 from the left-hand side. In the second column pair, the NMOS memory cells are represented by the reference characters N01, N11, N21, and N31 from the left-hand side, and the PMOS memory cells are represented by the reference characters P01, P11, P21, and P31 from the left-hand side.

< H-2. Programming >

Next, programming of the ROM 8000 will be discussed. In the first column pair of the ROM 8000 of FIG. 23, the gate electrode of NMOS transistor N1 of the memory cell N00 is connected to the ground potential GND (fixed in the OFF state), and the gate electrodes of NMOS transistors of other NMOS memory cells are connected to the word lines (to be ON/OFF controllable). The gate electrode of PMOS transistor P1 of the memory cell P00 is connected to the word line WLP0 (to be ON/OFF controllable), and the gate electrodes of PMOS transistors of other PMOS memory cells are connected to the power supply potential VDD (fixed in the OFF state).

In the second column pair, the gate electrode of NMOS transistor N6 of the memory cell N11 is connected to the ground potential GND (fixed in the OFF state), and the gate electrodes of NMOS transistors of other NMOS memory cells are connected to the word lines (to be ON/OFF controllable). The gate electrode of PMOS transistor P6 of the memory cell P11 is connected to the word line WLP1 (to be ON/OFF controllable), and the gate electrodes of PMOS transistors of other PMOS memory cells are connected to the power supply potential VDD (fixed in the OFF state).

The source electrodes of NMOS transistors N1 to N8 are connected in common to the ground potential GND, and the drain electrodes of NMOS transistors N2 and N3 are connected to the bit line BL0N. The drain electrodes of NMOS transistors N5 and N6 are connected in common to the bit line BL1N and the drain electrodes of NMOS transistors N7 and N8 are also connected in common to the bit line BL1N.

The source electrodes of PMOS transistors P1 to P8 are connected in common to the power supply potential VDD, and the drain electrodes of PMOS transistors P2 and P3 are not connected to the bit line BL0P. The drain electrodes of PMOS transistors P5 and P6 are connected in common to the bit line BL1P and the drain electrodes of PMOS transistors P7 and P8 are not connected in common to the bit line BL1P.

< H-3. Operation of ROM 8000 >

Next, an operation of the ROM 8000 of FIG. 23 will be discussed. When the address signal YA0 indicates "0", the NMOS transistor C0N and the PMOS transistor C0P acting as column selector CS turn on to select the bit lines BL0N and BL0P, that is, to select the first column pair.

Then, for example, if the memory cells N00 and P00 are selected, the PMOS transistor P1 carries a direct current, but the NMOS transistor N1 does not. Accordingly, the input of the inverting sense amplifier SA becomes the power supply potential VDD, i.e., "1" and the output thereof becomes "0".

If the memory cells N10 and P10 are selected, the NMOS transistor N2 carries a direct current, but the PMOS transistor P2 does not. Accordingly, the input of the inverting sense amplifier SA becomes the ground potential GND, i.e., "0" and the output thereof becomes "1".

Since the address signal YA0 indicates "0", the exclusive OR circuit EX does not act as an inverter to output the output of the inverting sense amplifier SA without inversion. Thus, the data in the first column pair are outputted without being changed.

On the other hand, when the address signal YA0 indicates "1", the NMOS transistor C1N and the PMOS transistor C1P acting as column selector CS turn on to select the bit lines BL1N and BL1P, that is, to select the second column pair.

Then, for example, if the memory cells N01 and P01 are selected, the NMOS transistor N5 carries a direct current, but the PMOS transistor P5 does not. Accordingly, the input of the inverting sense amplifier SA becomes "0" and the output thereof becomes "1".

Since the address signal YA0 indicates "1", the exclusive OR circuit EX acts as an inverter to invert the output of the inverting sense amplifier SA to be outputted. Thus, the data in the second column pair are outputted, being inverted.

FIG. 23 illustrates a case where the exclusive OR circuit EX acts as an inverter when the second column pair is selected. If the other input of the exclusive OR circuit EX is connected to the address signal line AL2, the exclusive OR circuit EX acts as an inverter when the first column pair is selected.

Furthermore, if the other input of the exclusive OR circuit EX is connected to the power supply potential VDD, the exclusive OR circuit EX acts as an inverter in both cases of selections of the first column pair and the second column pair, and if the other input of the exclusive OR circuit EX is connected to the ground potential GND, the exclusive OR circuit EX does not act as an inverter in either case of selections of the first column pair or the second column pair.

Figure 24A:
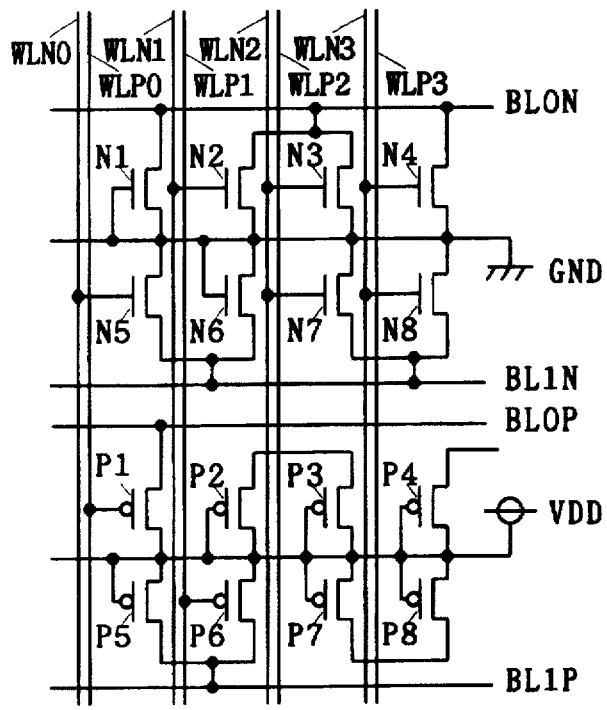
FIGS. 24A and 24B are diagram illustrating a layout of the semiconductor memory device in accordance with an eighth preferred embodiment of the present invention.
Figure 24B:
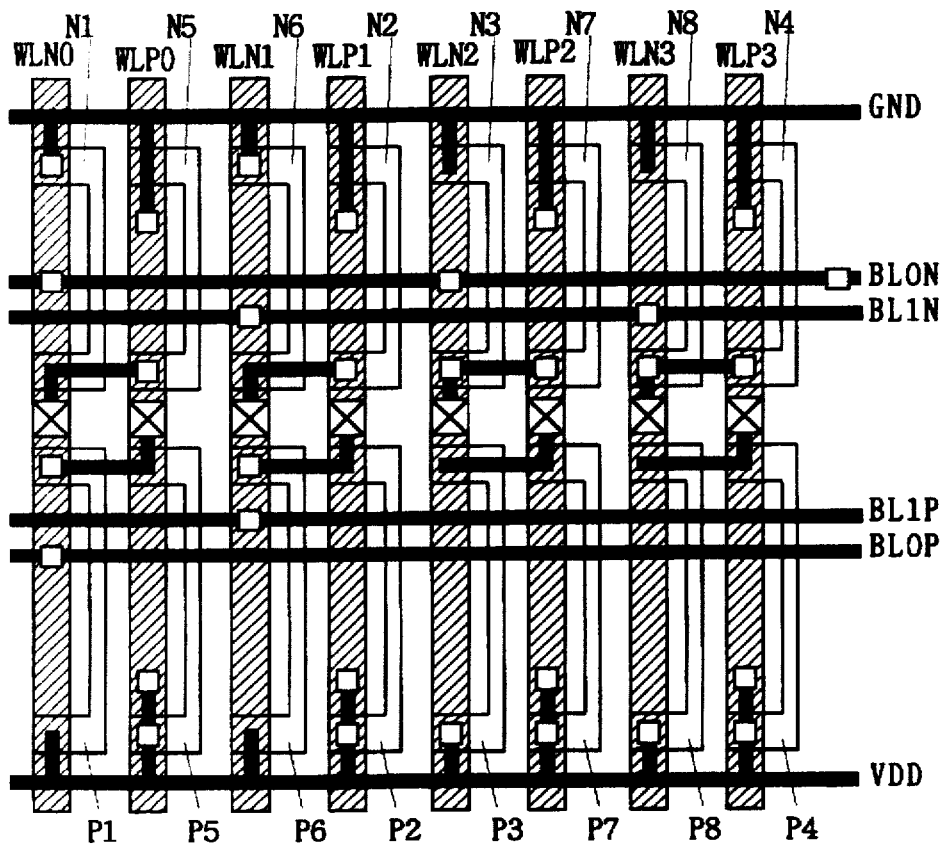
Figure 25:
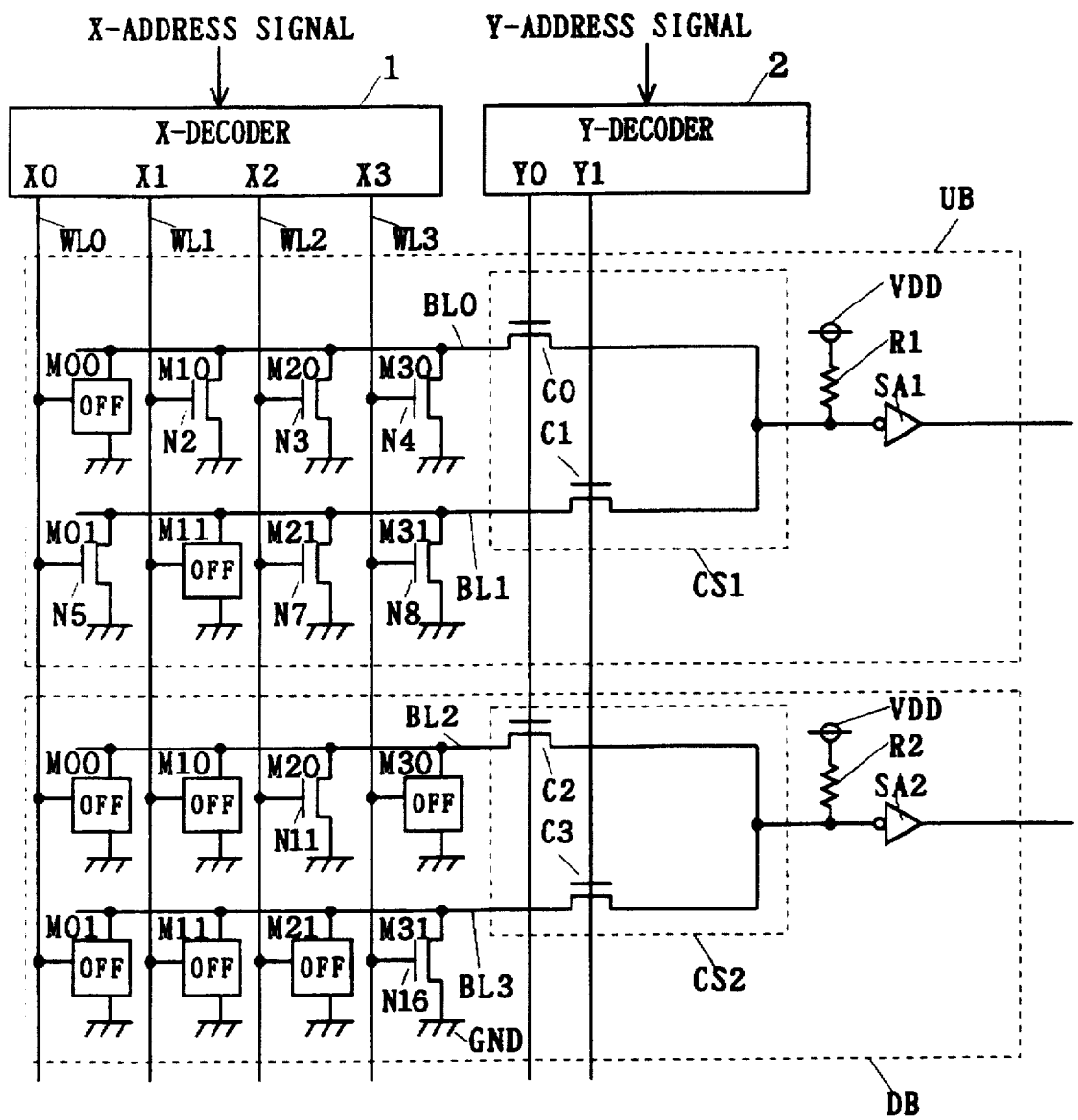
FIG. 25 is a circuit diagram of a semiconductor memory device in a first background art.

FIG. 24A is a circuit diagram of the memory cells of the ROM 8000 and FIG. 24B is a circuitry layout view of the memory cells of FIG. 24A, which include basic cell units of gate isolation type CMOS gate array.

Like the ROM 7000 of FIG. 22A, the transistors, each of which constitutes a memory cell carrying no direct current between the source and drain when selected, have the drain electrodes which are not connected to the bit lines in this figure. While the number of NMOS transistors which are not connected to the bit lines and the number of PMOS transistors which are not connected to the bit lines are almost the same in the ROM 7000, a smaller number of PMOS transistors, as compared with the NMOS transistors, are connected to the bit lines in the ROM 8000.

That results from the difference in current-carrying capability between an NMOS transistor and a PMOS transistor. In other words, the PMOS transistor requires more source-drain capacitance than that of the NMOS transistor when the same amount of current is produced in both the NMOS and PMOS transistors. One of the recent needs is that the NMOS transistor and the PMOS transistor should have the same operational property in order to obtain the same properties in rise and fall. For this reason, the basic cell unit of CMOS gate array in which the source-drain capacitance of the PMOS transistor is larger than that of the NMOS transistor is manufactured. FIG. 24B is the layout view of the circuit using such basic cell units of CMOS gate array.

In FIG. 24B, in order to express that the source-drain capacitance of the PMOS transistor is larger, the gate electrode of PMOS transistor is drawn larger.

In this case, there arises a problem that capacitance of the bit lines for the PMOS memory cells increases due to larger amount of source-drain capacitance of the PMOS transistor. The increase in capacitance of the bit line causes high power consumption and low-speed access to the memory cell.

< H-4. Characteristic Effect >

Having the configuration where one of the inputs of the exclusive OR circuit EX which is not connected to the inverting sense amplifier SA is so connected as to reduce the number of PMOS transistors whose drain electrodes are connected to the bit lines, the semiconductor memory device of the eighth preferred embodiment can suppress the increase in capacitance of the bit lines for the PMOS memory cells, and further suppress an increase in capacitance of a bit line pair consisting of a bit line for the NMOS memory cells and a bit line for the PMOS memory cells, thereby ensuring an operation with low power consumption and high-speed access to the memory cell.

Modification:

The first to eighth preferred embodiments has been discussed on the condition that the accesses to the memory cells are made with equal probability. There may be a case where the probability of access to the memory cells varies depending on the memory cells.

For example, in the first column, even if only one memory cell carries a direct current when selected, if the probability of access to this memory cell is more than 50% when the memory cell is programmed with the desired data without reversal, it is necessary to make reverse programming of this memory cell. For this reason, the probability of access to the memory cell when the memory cell is programmed with the desired data without reversal is calculated in advance through a logical simulation. Then, if it is calculated that the probability of direct current flowing in the whole column is more than 50%, it is needed to make reverse programming of the memory cells in the column.

Thus, even if the probability of being accessed varies depending on the memory cell, it is also possible to reduce a direct current flowing in the transistor, and therefore an effect of cutting the power consumption is achieved.

While the invention has been shown and described in detail, the foregoing description is in all aspects illustrative and not restrictive. It is therefore understood that numerous modifications and variations can be devised without departing from the scope of the invention.

I claim:
1. A semiconductor memory device, comprising:
    a plurality of columns each including an array of a plurality of memory cells; and
    an output part connected to said plurality of columns for amplifying and outputting output data of said plurality of columns,
    wherein said plurality of memory cells include at least one ON/OFF controllable memory cell and at least one OFF-state memory cell, and
    said plurality of memory cells are programmed with desired data by selectively arranging said at least one ON/OFF controllable memory cell and said at least one OFF-state memory cell,
    said output part of said semiconductor memory device including at least one data inverting means, for inverting data outputted from at least one specific column of said plurality of columns.
2. The semiconductor memory device of claim 1, wherein said desired data include data such that, if said at least one specific column of said plurality of columns are programmed with said desired data themselves, more than half of said plurality of memory cells in each of said some columns become said ON/OFF controllable memory cells, and
    said at least one specific column of said plurality of columns are programmed with reverse data of said desired data so that more than half of said plurality of memory cells in each of said at least one specific column become said OFF-state memory cells.
3. The semiconductor memory device of claim 1, wherein said desired data include data such that, if said at least one specific column of said plurality of columns are programmed with said desired data themselves, access is made to said ON/OFF controllable memory cells in each of said at least one specific column with a probability of more than 50%, and
    said at least one specific column of said plurality of columns are programmed with reverse data of said desired data so that access is made to said OFF-state memory cells in each of said at least one specific column with a probability of more than 50%.
4. The semiconductor memory device of claim 1, wherein said data inverting means is an inverter circuit.
5. The semiconductor memory of claim 1, further comprising:
    a plurality of column selecting means provided between said output part and said plurality of columns respectively, for determining whether said respective columns are selected or not in accordance with a column selection signal externally applied,
    wherein said data inverting means inverts said data outputted from said output part only when said at least one specific column are selected.
6. The semiconductor memory device of claim 5, wherein said data inverting means is a two-input exclusive OR circuit in which one input is connected to said output part and the other input is given said column selection signal.
7. The semiconductor memory device of claim 5, wherein said data inverting means includes column discrimination means for judging whether said at least one specific column are selected or not in accordance with said column selection signal;
    said column discrimination means is a combinational logic circuit having inputs as much as said at least one specific column, said column selection signal applied to said column selecting means of said at least one specific column is connected to one of said inputs of said combinational logic circuit, and a control signal for controlling said data inverting means is outputted to invert said data outputted from said output part when said at least one specific column are selected.

8. The semiconductor memory device of claim 7, wherein said combinational logic circuit is an OR circuit having inputs as much as said at least one specific column.

9. The semiconductor memory device of claim 5, wherein said data inverting means includes column discrimination means for judging whether said at least one specific column are selected or not in accordance with said column selection signal, said column discrimination means is a combinational logic circuit having inputs as much as said plurality of columns, said column selection signal applied to said column selecting means of said at least one specific column is connected to one of said inputs of said combinational logic circuit, other inputs of said combinational logic circuit which do not receive said column selection signal are fixed in a prescribed logic, and a control signal for controlling said data inverting means is outputted to invert said data outputted from said output part when said at least one specific column are selected.

10. The semiconductor memory device of claim 9, wherein said combinational logic circuit is an OR circuit having inputs as much as said plurality of columns.

11. The semiconductor memory device of claim 5, wherein said data inverting means includes column discrimination means for judging whether said at least one specific column are selected or not in accordance with said column selection signal, said column discrimination means is a combinational logic circuit having inputs half as much as said plurality of columns, and wherein a control signal for controlling said data inverting means is outputted to invert said data outputted from said output part when said at least one specific column are selected, by means that said column selection signal applied to said column selecting means of said plurality of columns other than said at least one specific column is connected to said inputs of said combinational logic circuit and other inputs of said combinational logic circuit which do not receive said column selection signal are fixed in a prescribed logic, or said column selection signal applied to said column selecting means of said at least one specific column is connected to said inputs of said combinational logic circuit and other inputs of said combinational logic circuit which do not receive said column selection signal are fixed in a prescribed logic.

12. The semiconductor memory device of claim 11, wherein said combinational logic circuit includes an OR circuit having inputs half as much as said plurality of columns and a two-input exclusive OR circuit in which one input is connected to an output of said OR circuit and the other input is fixed in a prescribed logic.

13. The semiconductor memory device of claim 1, wherein said at least one OFF-state memory cell and said at least one ON/OFF controllable memory cell have transistors, and said transistors are of the same conductivity type.

14. The semiconductor memory device of claim 5, wherein said at least one OFF-state memory cell and said at least one ON/OFF controllable memory cell have transistors, and wherein said transistors include N-channel transistors and P-channel transistors, and each of said plurality of columns includes said transistors of the same conductivity type.

15. A semiconductor memory device, comprising:

at least one column pair consisting a first column including an array of a plurality of memory cells each of which has an N-channel transistor and a second column including an array of a plurality of memory cells each of which has a P-channel transistor; and an output part connected to said column pair, wherein said first column and said second column are selected interlockedly, and said plurality of memory cells in said first column and said second column are programmed with desired data by making connection of said N-channel transistor and said P-channel transistor in said memory cells of the same X-address in said first column and said second column so that one of these transistors may be ON/OFF controllable and the other may be fixed in an OFF state, and wherein if more than half of said P-channel transistors in said second column are ON/OFF controllable when programmed with said desired data themselves, said plurality of memory cells are programmed with reverse data which are opposite to said desired data so that more than half of said N-channel transistors in said first column may be ON/OFF controllable, said semiconductor memory device further comprising data inverting means for inverting said reverse data outputted from said output part.

16. The semiconductor memory device of claim 15, wherein said at least one column pair includes a plurality of column pairs, each of said column pairs is programmed with either said desired data or said reverse data, and said data inverting means inverts said reverse data only when a column pair programmed with said reverse data is selected.

17. The semiconductor memory device of claim 15, wherein each of said transistors which are fixed in an OFF state has a control electrode which is not connected to a word line but connected to a prescribed potential to always keep said transistors in an OFF state.

18. The semiconductor memory device of claim 15, wherein each of said transistors which are fixed in an OFF state has a control electrode which is not connected to a word line but connected to a prescribed potential to always keep said transistors in an OFF state, and two main electrodes neither of which is connected to a bit line.

19. The semiconductor memory device of claim 18, wherein
- said N-channel transistors are NMOS transistors formed as basic cell units of CMOS gate array, and
- said P-channel transistors are PMOS transistors formed as basic cell units of CMOS gate array.

20. A semiconductor memory device, comprising:
- at least one memory cell having an address defined by a bit line and a word line, wherein said at least one memory cell includes at least one transistor, each transistor comprising,
  - a control electrode connected to a prescribed potential to maintain said at least one transistor in an OFF state, and
  - two main electrodes electrically isolated from said word line and said bit line, such that a potential on said bit line cannot be altered by said transistor.

* * * * *